US012588206B2

(12) United States Patent
Hung

(10) Patent No.: US 12,588,206 B2
(45) Date of Patent: Mar. 24, 2026

(54) MEMORY DEVICE WITH REFORMED INSULATING LAYER AND METHOD OF FABRICATING THE SAME

(71) Applicant: MACRONIX International Co., Ltd., Hsinchu (TW)

(72) Inventor: Min-Feng Hung, Hsing-Chu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 404 days.

(21) Appl. No.: 18/186,961

(22) Filed: Mar. 21, 2023

(65) Prior Publication Data

US 2024/0324199 A1 Sep. 26, 2024

(51) Int. Cl.
*H10B 43/27* (2023.01)
*H10B 43/10* (2023.01)
*H10B 43/30* (2023.01)

(52) U.S. Cl.
CPC ............. *H10B 43/27* (2023.02); *H10B 43/10* (2023.02); *H10B 43/30* (2023.02)

(58) Field of Classification Search
CPC ........ H10B 53/00; H10B 53/10; H10B 53/20;
H10B 53/30; H10B 53/40; H10B 53/50;
H10B 41/00; H10B 41/10; H10B 41/20;
H10B 41/23; H10B 41/27; H10B 41/30;
H10B 41/35; H10B 41/40–44; H10B
41/46–50; H10B 41/60; H10B 41/70;
H10B 43/00; H10B 43/10; H10B 43/20;
H10B 43/23; H10B 43/27; H10B 43/30;
H10B 43/35; H10B 43/40; H10B 43/50;
(Continued)

(56) References Cited

U.S. PATENT DOCUMENTS

| | | | |
|---|---|---|---|
| 7,696,559 B2* | 4/2010 | Arai | H10D 30/69 |
| | | | 257/315 |
| 9,997,462 B2* | 6/2018 | Ha | H10B 43/27 |

(Continued)

FOREIGN PATENT DOCUMENTS

| | | |
|---|---|---|
| TW | I787080 | 12/2022 |
| TW | 202310363 | 3/2023 |

OTHER PUBLICATIONS

"Office Action of Taiwan Counterpart Application", issued on Nov. 7, 2023, pp. 1-5.

*Primary Examiner* — William B Partridge
*Assistant Examiner* — Gustavo G Ramallo
(74) *Attorney, Agent, or Firm* — J.C. PATENTS

(57) ABSTRACT

A memory device includes a stacked structure, a channel pillar, a plurality of conductive pillars, and a slit. The stacked structure is located on a dielectric substrate, and includes a plurality of conductive layers and a plurality of insulating layers stacked alternately. The channel pillar extends through the stacked structure. The plurality of conductive pillars are located in the channel pillar and electrically connected with the channel pillar. The charge storage structure is located between the plurality of conductive layers and the channel pillar. The slit is located in the stacked structure. The slit includes a body part and an extension part. The body part extends through the stacked structure. The extension part is connected to the body part and located between the stacked structure and the dielectric substrate. The memory may be applied in 3D AND flash memory.

19 Claims, 25 Drawing Sheets

(58) Field of Classification Search
    CPC ........ H10B 51/00; H10B 51/10; H10B 51/20;
              H10B 51/30; H10B 51/40; H10B 51/50
    See application file for complete search history.

(56)                    References Cited

U.S. PATENT DOCUMENTS

| | | | | |
|---|---|---|---|---|
| 2013/0270643 A1* | 10/2013 | Lee | ........................ | H10B 43/27 |
| | | | | 257/365 |
| 2015/0104916 A1* | 4/2015 | Lee | ........................ | H10B 43/20 |
| | | | | 438/268 |
| 2021/0193677 A1* | 6/2021 | Lue | ........................ | H10B 51/20 |
| 2023/0363159 A1* | 11/2023 | Tseng | ..................... | H10B 43/27 |

* cited by examiner

MEMORY DEVICE WITH REFORMED INSULATING LAYER AND METHOD OF FABRICATING THE SAME

BACKGROUND

Technical Field

The present disclosure relates to a semiconductor device and a fabricating method thereof, and in particular to a memory device and a fabricating method thereof.

Description of Related Art

A non-volatile memory device (e.g., flash memory) has become a type of memory device widely used in personal computers and other electronic devices due to the advantage that the stored data will not disappear after being powered off.

Currently, the flash memory array commonly used in the industry includes a NOR flash memory and a NAND flash memory. Since the structure of NAND flash memory is to connect memory cells in series, the integration and area utilization thereof are better than that of NOR flash memory, and it has been widely used in various electronic products. In addition, in order to further enhance the integration of memory devices, a 3D NAND flash memory has been developed. However, there are still many challenges associated with the 3D NAND flash memory.

SUMMARY

The disclosure provides a memory device and a fabricating method thereof, which can avoid the problem of abnormal bridging between the conductive pillar and the conductive layer below the stacked gate.

A memory device according to an embodiment of the present disclosure includes a stacked structure, a channel pillar, a plurality of conductive pillars, a charge storage structure and a slit. The stacked structure is located on the dielectric substrate, includes a plurality of conductive layers and a plurality of insulating layers stacked alternately. The channel pillar extends through the stacked structure. The plurality of conductive pillars are located in the channel pillar and electrically connected to the channel pillar. The charge storage structure is located between the plurality of conductive layers and the channel pillar. The slit is located in the stacked structure. The slit includes: a body part and an extension part. The body part extends through the stacked structure. The extension part is connected with the body part and is located between the stacked structure and the dielectric substrate.

A method of fabricating a memory device according to an embodiment of the present disclosure includes the following steps. A first conductive layer is formed on the dielectric substrate. A stacked structure is formed on the first conductive layer. The stacked structure includes a plurality of intermediate layers and a plurality of insulating layers stacked alternately. A channel pillar is formed to extend through the stacked structure and the first conductive layer. A plurality of conductive pillars electrically connected to the channel pillar are formed in the channel pillar. A slit trench is formed to extend through the stacked structure and the first conductive layer. Portions the first conductive layer, the channel pillar and the plurality of conductive pillars are removed to form a first horizontal opening. The plurality of intermediate layers are partially removed to form a plurality of second horizontal openings. A charge storage layer is formed in the first horizontal opening and the plurality of second horizontal openings. A plurality of second conductive layers are formed in the plurality of second horizontal openings. A body part of a slit is formed in the slit trench, and an extension part of the slit is formed in the first horizontal opening.

Based on the above, the memory device of the embodiment of the present disclosure removes the conductive layer originally disposed under the stacked structure, and then reforms the insulating layer to avoid the problem of abnormal bridging between the conductive pillar and the conductive layer under the stacked gate.

DESCRIPTION OF THE EMBODIMENTS

Figure 1A:
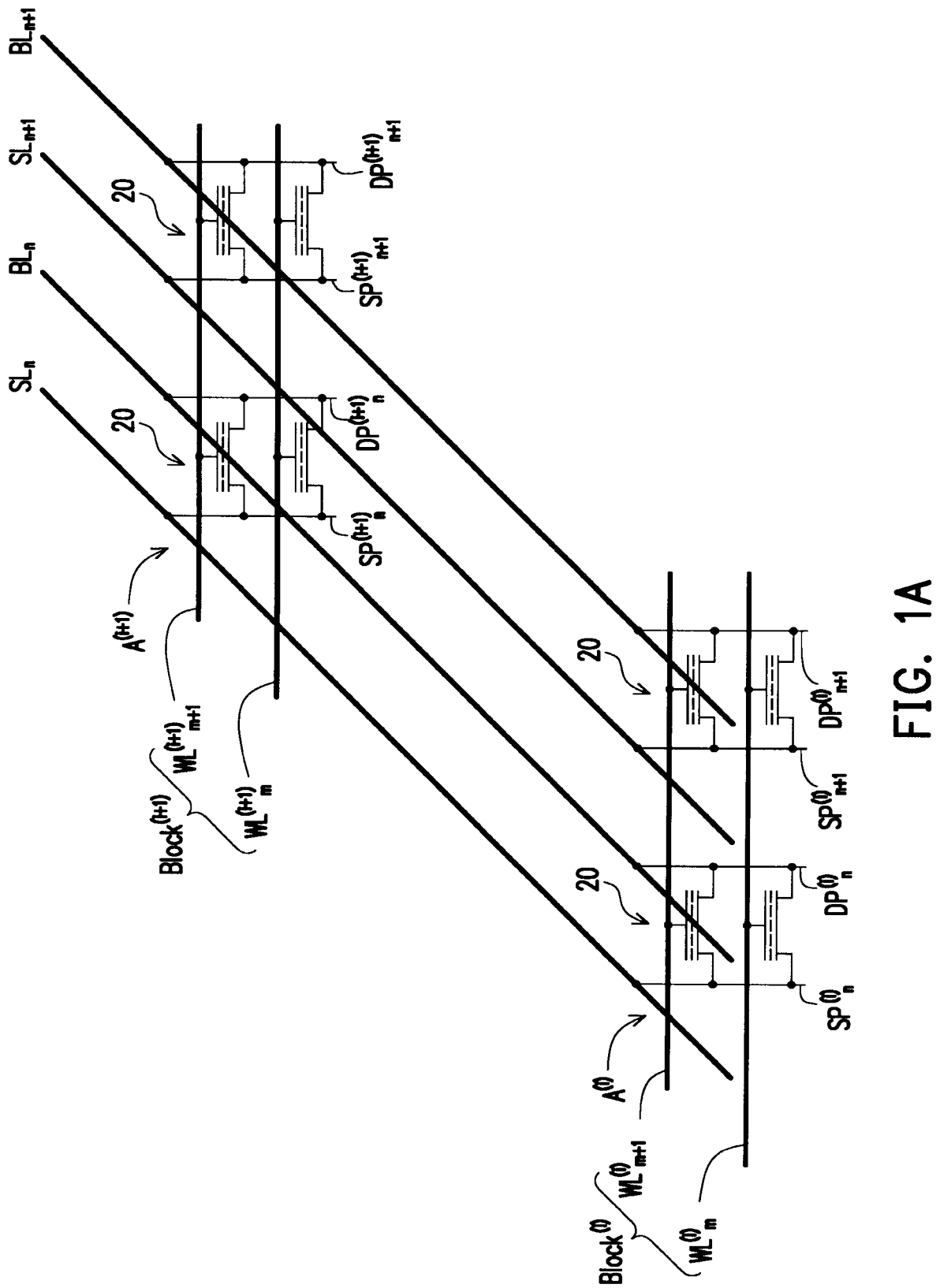
FIG. 1A shows a circuit diagram of a 3D AND flash memory array according to some embodiments.
Figure 1B:
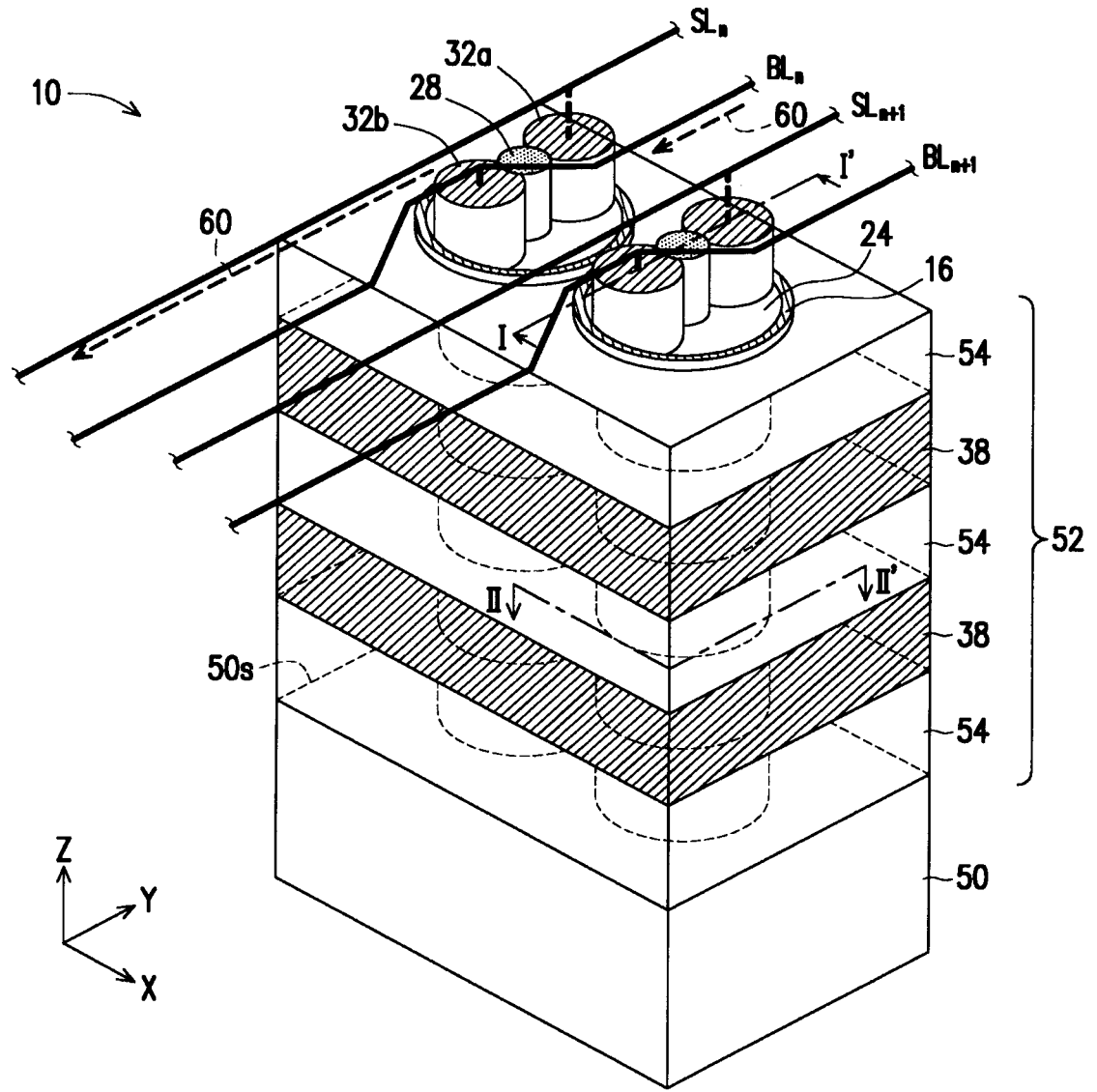
FIG. 1B shows a partial 3D view of a portion of the memory array in FIG. 1A.
Figure 1C:
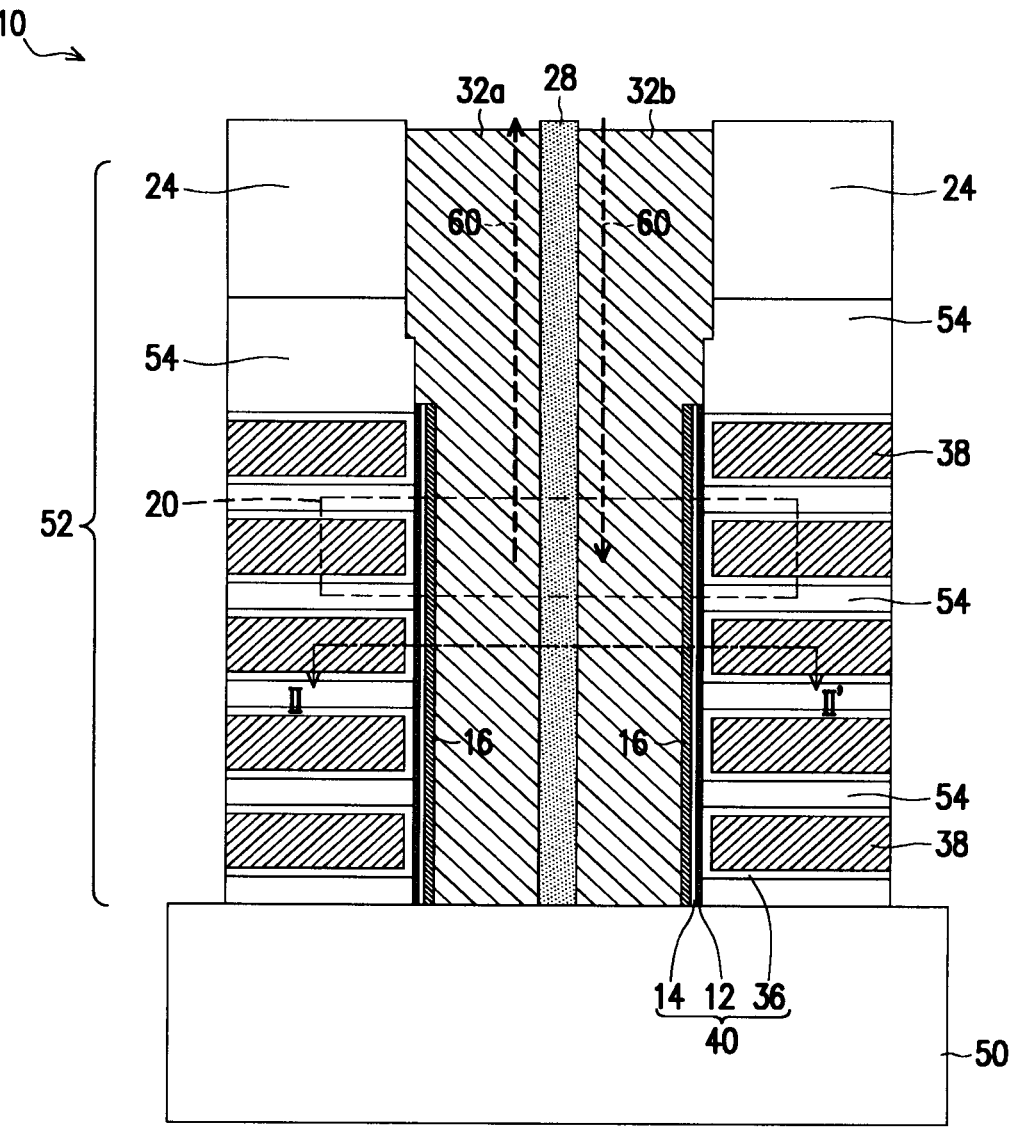
FIG. 1C and FIG. 1D show cross-sectional views along the line I-I' of FIG. 1B.
Figure 1D:
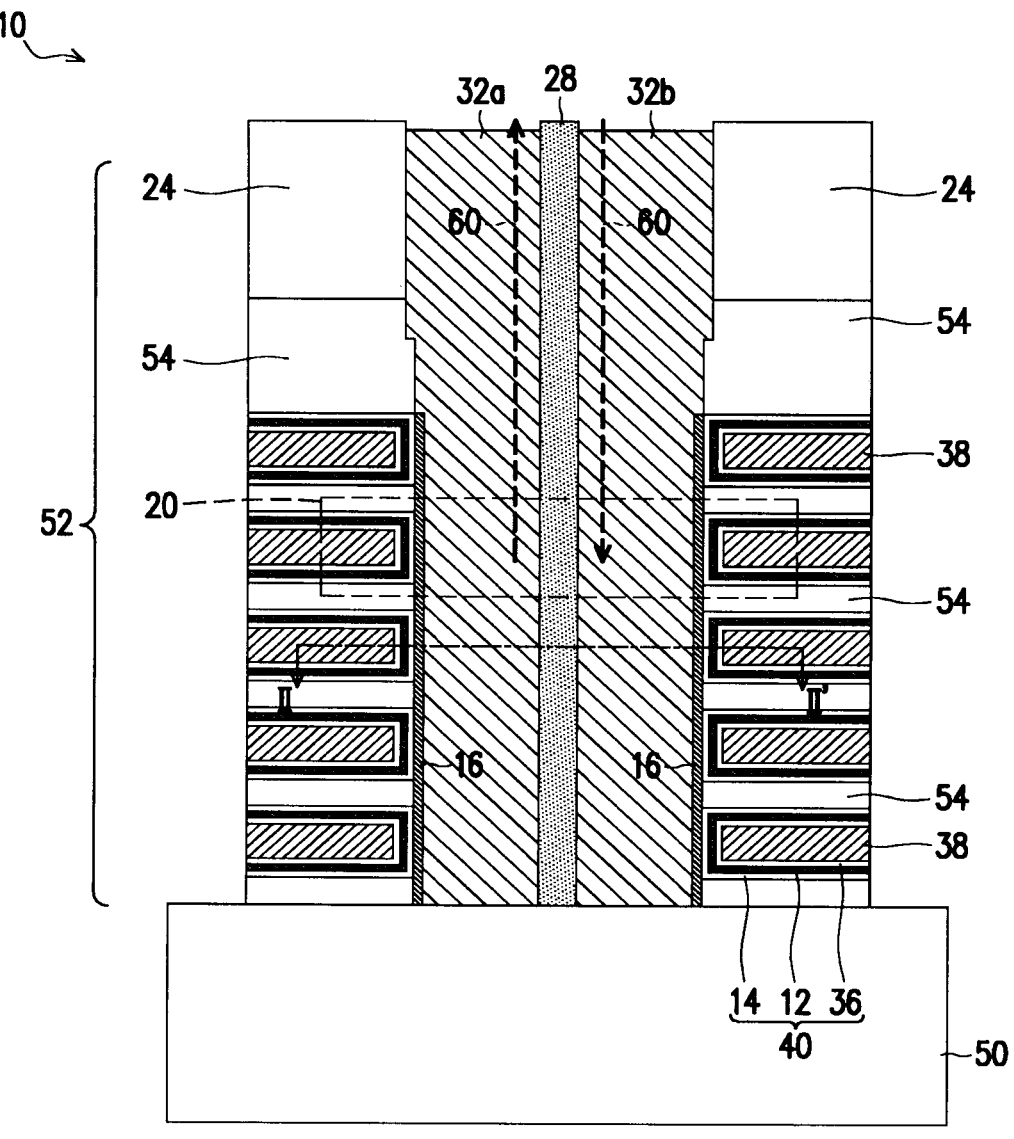
Figure 1E:
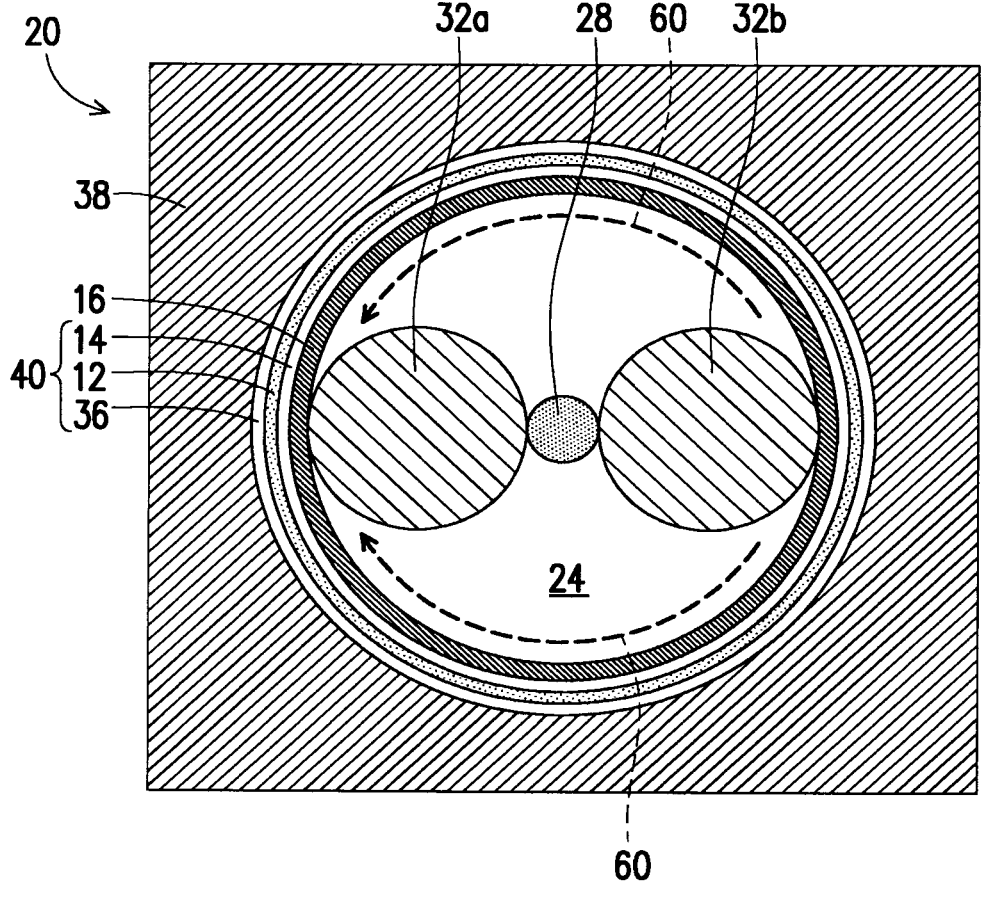
FIG. 1E shows a top view of the line II-II' of FIG. 1B, FIG. 1C, FIG. 1D.

FIG. 1A shows a circuit diagram of a 3D AND flash memory array according to some embodiments. FIG. 1B shows a partial 3D view of a portion of the memory array in FIG. 1A. FIG. 1C and FIG. 1D show cross-sectional views along the line I-I' of FIG. 1B. FIG. 1E shows a top view of the line II-II' of FIG. 1B, FIG. 1C and FIG. 1D.

FIG. 1A is a schematic diagram of two blocks $BLOCK^{(i)}$ and $BLOCK^{(i+1)}$ including a vertical AND memory array 10 arranged in columns and rows. The block $BLOCK^{(i)}$ includes memory array $A^{(i)}$. A row of memory array $A^{(i)}$ (for example, m+1th row) is a set of AND memory cells 20 having a common word line (for example, $WL^{(i)}_{m+1}$). The AND memory cells 20 of each row of the memory array $A^{(i)}$ (for example, m+1th row) correspond to a common word line (for example, $WL^{(i)}_{m+1}$), and are coupled to different source pillars (for example, $SP^{(i)}_n$ and $SP^{(i)}_{n+1}$) and drain pillars (such as $DP^{(i)}_n$ and $DP^{(i)}_{n+1}$), so that the AND memory cells 20 are along the common word line (such as $WL^{(i)}_{m+1}$) logically configured into a row.

A column (for example, the nth column) of the memory array $A^{(i)}$ is a set of AND memory cells 20 having a common source pillar (e.g., $SP^{(i)}_n$) and a common drain pillar (e.g., $DP^{(i)}_n$). The AND memory cells 20 of each column (for example, the nth column) of the memory array $A^{(i)}$ correspond to different word lines (for example, $WL^{(i)}_{m+1}$ and $WL^{(i)}_m$), and are coupled to a common source pillar (e.g., $SP^{(i)}_n$) and a common drain pillar (e.g., $DP^{(i)}_n$). Therefore, the AND memory cells 20 of the memory array $A^{(i)}$ are logically arranged in a column along the common source pillar (e.g., $SP^{(i)}_n$) and the common drain pillar (e.g., $DP^{(i)}_n$). In a physical layout, for high density or for other reasons, the rows or columns may be distorted, arranged in a honeycomb pattern or otherwise, depending on the fabricating method applied.

In FIG. 1A, in the block $BLOCK^{(i)}$, the AND memory cells 20 in nth column of memory array $A^{(i)}$ share the common source pillar (for example, $SP^{(i)}_n$) and the common drain pillar (for example, $DP^{(i)}_n$). The AND memory cells 20 in n+1th column share the common source pillar (e.g., $SP^{(i)}_{n+1}$) and the common drain pillar (e.g., $DP^{(i)}_{n+1}$).

The common source pillar (e.g., $SP^{(i)}_n$) is coupled to a common source line (e.g., $SL_n$); the common drain pillar (e.g., $DP^{(i)}_n$) is coupled to a common bit line (e.g., $BL_n$). The common source pillar (e.g., $SP^{(i)}_{n+1}$) is coupled to a common source line (e.g., $SL_{n+1}$); the common drain pillar (e.g., $DP^{(i)}_{n+1}$) is coupled to a common bit line (e.g., $BL_{n+1}$).

Similarly, the block $BLOCK^{(i+1)}$ includes memory array $A^{(i+1)}$, which is similar to memory array $A^{(i)}$ in the block $BLOCK^{(i)}$. A row (for example, m+1th row) of memory array $A^{(i+1)}$ is a set of AND memory cells 20 having a common word line (for example, $WL^{(i+1)}_{m+1}$). The AND memory cells 20 of each row (for example, m+1th row) of memory array $A^{(i+1)}$ correspond to the common word line (for example, $WL^{(i+1)}_{m+1}$), and are coupled to different source pillars (e.g., $SP^{(i+1)}_n$ and $SP^{(i+1)}_{n+1}$) and drain pillars (e.g., $DP^{(i+1)}_n$ and $DP^{(i+1)}_{n+1}$). A column (for example, nth column) of memory array $A^{(i+1)}$ is a set of AND memory cells 20 with a common source pillar (for example, $SP^{(i+1)}_n$) and a common drain pillar (for example, $DP^{(i+1)}_n$). The AND memory cells 20 of each column (for example, nth column) of memory array $A^{(i+1)}$ correspond to different word lines (for example, $WL^{(i+1)}_{m+1}$ and $WL^{(i+1)}_m$), and are coupled to a common source pillar (e.g., $SP^{(i+1)}_n$) and a common drain pillar (e.g., $DP^{(i+1)}_n$). Therefore, the AND memory cells 20 of the memory array $A^{(i+1)}$ are logically arranged in a column along the common source pillar (e.g., $SP^{(i+1)}_n$) and the common drain pillar (e.g., $DP^{(i+1)}_n$).

The block $BLOCK^{(i+1)}$ and the block $BLOCK^{(i)}$ share the source lines (e.g., $SL_n$ and $SL_{n+1}$) and the bit lines (e.g., $BL_n$ and $BL_{n+1}$). Therefore, the source line $SL_n$ and the bit line $BL_n$ are coupled to the AND memory cells 20 of nth column in the AND memory array $A^{(i)}$ of the block $BLOCK^{(i)}$, and are coupled to the AND memory cells 20 of nth column in the AND memory array $A^{(i+1)}$ of the block $BLOCK^{(i+1)}$. Similarly, the source line SL n+1 and the bit line BL n+1 are coupled to the AND memory cells 20 of n+1th column in the AND memory array $A^{(i)}$ of the block $BLOCK^{(i)}$, and are coupled to the AND memory cells 20 of n+1th column in the AND memory array $A^{(i+1)}$ of the block $BLOCK^{(i+1)}$.

Referring to FIG. 1B to FIG. 1D, the memory array 10 may be disposed on the interconnect structure of the semiconductor die. For example, the memory array 10 is disposed above one or more active devices (such as transistors) formed on the semiconductor substrate. Therefore, the dielectric substrate (or referred to as the dielectric layer) 50 is, for example, a dielectric layer formed above the metal interconnect structure on the silicon substrate, such as a silicon oxide layer. The memory array 10 may include a stacked structure 52, a plurality of channel pillars 16, a plurality of first conductive pillars (also referred to as source pillars) 32a, a plurality of second conductive pillars (also referred to as drain pillars) 32b, and a plurality of charge storage structure 40.

Referring to FIG. 1B, the stacked structure 52 is formed on a dielectric substrate 50. The stacked structure 52 includes a plurality of gate layers (also referred to as word lines or conductive layers) 38 and a plurality of insulating layers 54 vertically stacked on the surface 50s of the dielectric substrate 50. In the third direction Z, these gate layers 38 are electrically isolated from each other by the insulating layers 54 arranged between them. The gate layer 38 extends in a direction parallel to the surface 50s of the dielectric substrate 50. The gate layers 38 of the staircase area (not shown) may have a staircase structure (not shown). Therefore, the gate layer 38 of the lower part is longer than the gate layer 38 of the upper part, and the end of the gate layer 38 of the lower part extends laterally and protrudes from the end of the gate layer 38 of the upper part. Contacts (not shown) for connecting the gate layers 38 may land at the ends of the gate layers 38, thereby connecting each gate layer 38 to each conductive line.

Referring to FIG. 1B to FIG. 1D, the memory array 10 further includes a plurality of channel pillars 16, an insulating pillar 28, a plurality of first conductive pillar 32a and a plurality of second conductive pillar 32b, formed in the vertical channel hole (not shown) extending through the stacked structure 52. The channel pillar 16 extends continuously through stacked structure 52. In some embodiments, the channel pillar 16 may have a ring-shaped profile from the top view. The material of the channel pillar 16 may be semiconductor, such as undoped polysilicon. In this example, the first conductive pillar 32a serves as the source pillar; the second conductive pillar 32b serves as the drain pillar. The first conductive pillar 32a, the second conductive pillar 32b and the insulating pillar 28 each extend in a direction (i.e., third direction Z) perpendicular to the surface (i.e., XY plane) of the gate layer 38. The first conductive pillar 32a and the second conductive pillar 32b are separated by the insulating pillar 28 and surrounded by the insulating filling layer 24. The first conductive pillar 32a and the second conductive pillar 32b are electrically connected to the channel pillar 16. The first conductive pillar 32a and the second conductive pillar 32b include doped polysilicon or metal materials. The insulating pillar 28 is, for example, silicon nitride or silicon oxide, and the insulating filling layer 24 is, for example, silicon oxide.

Referring to FIG. 1C and FIG. 1D, the charge storage structure 40 is disposed between the channel pillar 16 and the plurality of gate layers (or referred to as conductive layers) 38. The charge storage structure 40 may include a tunneling layer (or referred to as an energy gap engineered tunneling oxide layer) 14, a charge storage layer 12 and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride, or other materials that can trap charges. In some embodiments, as shown in FIG. 1C, a portion of the charge storage structure 40 (tunneling layer 14 and charge storage layer 12) extends continuously in a direction (i.e., third direction Z) perpendicular to the gate layer 38, while another portion of the charge storage structure 40 (blocking layer 36) surrounds the gate layer 38. In other embodiments, as shown in FIG. 1D, the charge storage structure 40 (tunneling layer 14, charge storage layer 12 and blocking layer 36) surrounds the gate layer 38.

Referring to FIG. 1E, the charge storage structure 40, the channel pillar 16, the source pillar 32a and the drain pillar 32b are surrounded by the gate layer 38 and define the memory cell 20. The memory cell 20 can perform 1-bit operation or 2-bit operation through different operation methods. For example, when a voltage is applied to the source pillar 32a and the drain pillar 32b, since the source pillar 32a and the drain pillar 32b are connected to the channel pillar 16, electrons are transmitted along the channel pillar 16 and stored in the entire charge storage structure 40, such that 1-bit operation is performed on the memory cell 20. In addition, for the operation using Fowler-Nordheim tunneling, electrons or holes are trapped in the charge storage structure 40 between the source pillar 32a and the drain pillar 32b. For the operation of source side injection, channel-hot-electron injection, or band-to-band tunneling hot carrier injection, electrons or holes are partially trapped in the charge storage structure 40 of one of the source pillar 32a and the drain pillar 32b adjacent to each other, so that the memory cell 20 is performed the operation of unit cell (SLC, 1 bit) or multi-level cell (MLC, greater than or equal to 2 bits).

In operation, when a voltage (for example, a corresponding starting voltage ($V_{th}$) higher than that of the corresponding memory cell 20) is applied to a selected word line (gate layer) 38, a channel region of the channel pillar 16 intersecting the selected word line 38 is turned on, current is allowed to enter the drain pillar 32b from the bit line $BL_n$ or $BL_{n+1}$ (shown in FIG. 1B) and flow to the source pillar 32a through the channel region being turned on (e.g., in the direction indicated by arrow 60), and finally flows to the source line $SL_n$ or $SL_{n+1}$ (shown in FIG. 1B).

In some embodiments, a conductive layer is also provided between the stacked structure 52 and the dielectric substrate 50, the conductive layer is used as a stop layer for etching the vertical channel hole, and the conductive layer is grounded so that the channel that the word line cannot control can be turned off normally. However, due to process factors, the sidewall of the vertical channel hole usually has a sloped profile, such that the vertical channel hole is tapered. When forming the holes of the source pillar (conductive pillar) 32a and the drain pillar (conductive pillar) 32b, the dielectric layer on the sidewall of the conductive layer is likely to be depleted or removed during the etching process or cleaning process, such that the sidewall of the conductive layer is exposed in the holes, resulting in abnormal bridging between the subsequently formed source pillar (conductive pillar) 32a and the conductive layer and between the subsequently formed drain pillar (conductive pillar) 32b and the conductive layer.

The memory device of the embodiment of the present disclosure can avoid the problem of abnormal bridging between the conductive pillar and the conductive layer below the stacked gate by removing the conductive layer originally disposed below the stacked structure, and then reforming the insulating layer in a subsequent process.

FIG. 2A to FIG. 2K are top views of a method of fabricating a memory device according to an embodiment of the present disclosure. FIG. 3A to FIG. 3K are cross-sectional views along line x-x' of FIG. 2A to FIG. 2K. FIG. 3I' to FIG. 3K' are cross-sectional views along line y-y' of FIG. 2I to FIG. 2K. FIG. 2A to FIG. 2G are top views of line I-I' of FIG. 3A to FIG. 3G. FIG. 2H to FIG. 2K are top views of the line II-II' of FIG. 3H to FIG. 3K'.

Figure 2A:
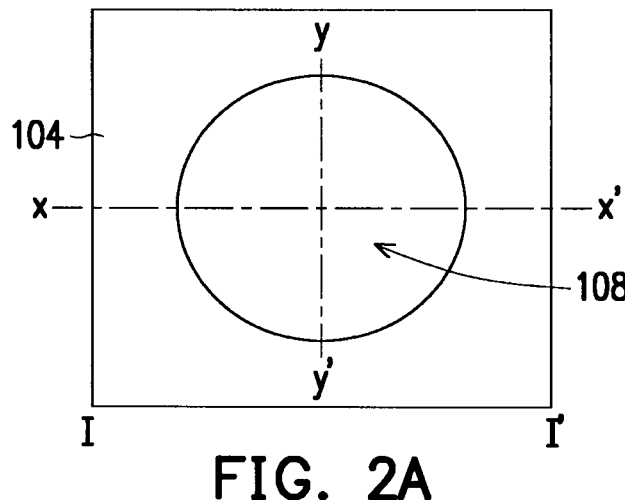
FIG. 2A to FIG. 2K are top views of a method of fabricating a memory device according to an embodiment of the present disclosure.
Figure 3A:
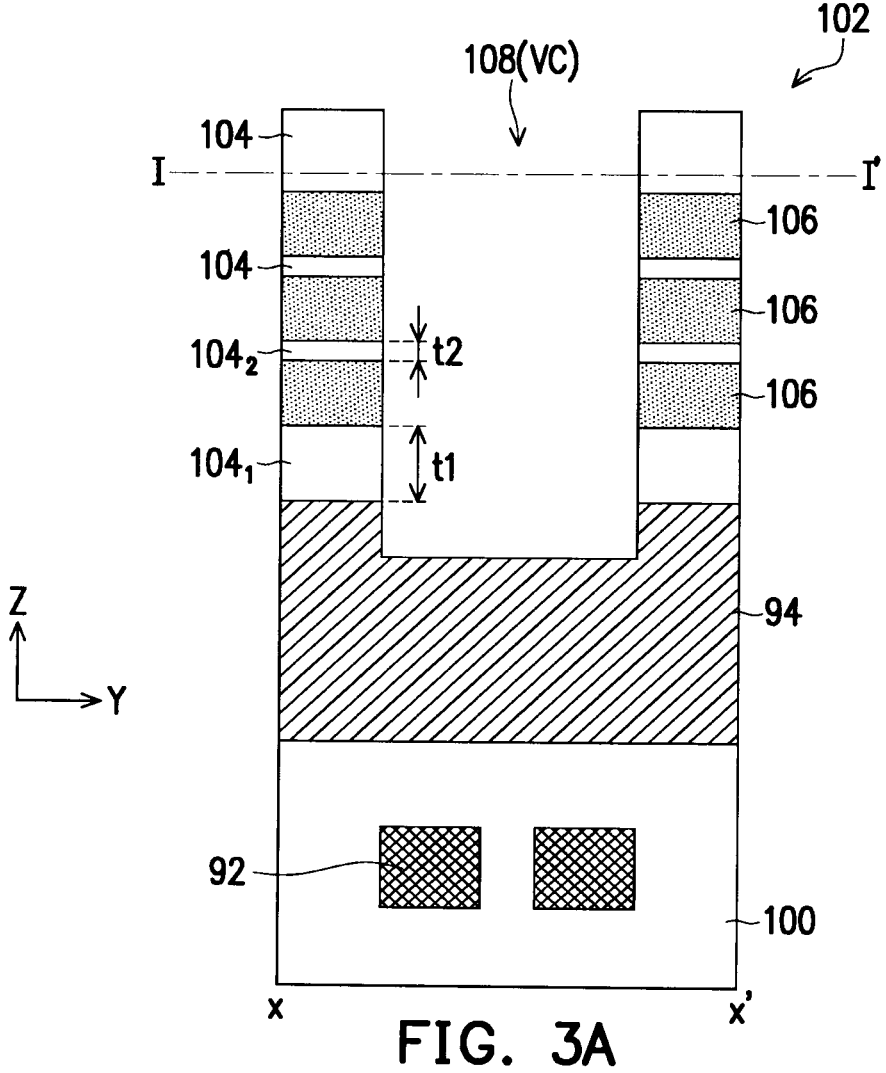
FIG. 3A to FIG. 3K' are cross-sectional views of lines x-x' and y-y' in FIG. 2A to FIG. 2K.
Figure 2B:
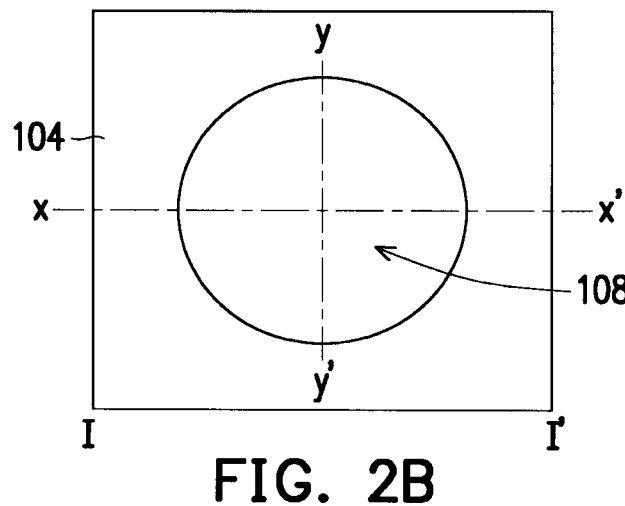

Referring to FIG. 2A and FIG. 3A, a dielectric substrate 100 is provided. The dielectric substrate 100 is, for example, a dielectric layer having a metal interconnect structure formed on a silicon substrate, such as a silicon oxide layer. The dielectric substrate 100 has a stop layer 92 therein. The stop layer 92 is, for example, a patterned polysilicon layer. A conductive layer 94 is formed on the dielectric substrate 100. The material of the conductive layer 94 is, for example, polysilicon. A stacked structure 102 is formed on the conductive layer 94. The stacked structure 102 may also be referred to as an insulating stacked structure 102. In this embodiment, the stacked structure 102 is composed of insulating layers 104 and intermediate layers 106 stacked sequentially and alternately on the dielectric substrate 100. In other embodiments, the intermediate layers 106 and the insulating layers 104 are stacked alternately on the dielectric substrate 100 in reverse order. In addition, in this embodiment, the uppermost layer of the stacked structure 102 is the insulating layer 104. The thickness t1 of the bottommost insulating layer $104_1$ is greater than the thickness t2 of the insulating layer $104_2$ between the intermediate layers 106. The insulating layer 104 is, for example, a silicon oxide layer. The intermediate layer 106 is, for example, a silicon nitride layer. In this embodiment, the stacked structure 102 has 4 layers of insulating layers 104 and 3 layers of intermediate layers 106, but the present disclosure is not limited thereto. In other embodiments, more insulating layers 104 and intermediate layers 106 may be formed according to actual needs. Afterwards, the stacked structure 102 is patterned to form a staircase structure (not shown). Lithography and etching processes are performed to form a plurality of openings 108 (or referred to as vertical channel holes VC) in the stacked structure 102. However, only a single opening 108 is shown in FIG. 2A and FIG. 2B. The bottom surface of the opening 108 exposes the conductive layer 94 but does not expose the dielectric substrate 100.

Figure 3B:
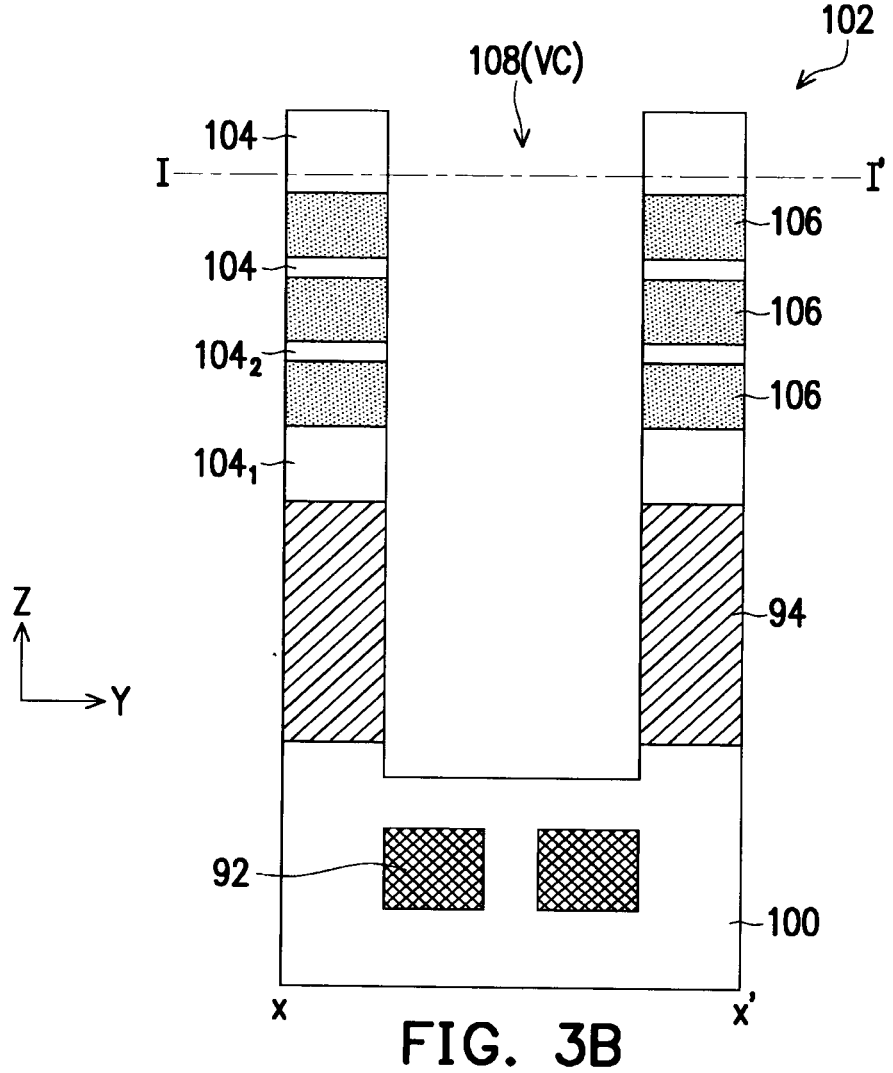

Referring to FIG. 2B and FIG. 3B, the etching process is continued to deepen the opening 108 so that the bottom part of the opening 108 extends into the dielectric substrate 100. In this embodiment, from the top view, the opening 108 has a circular shape, but the disclosure is not limited thereto. In other embodiments, the opening 108 may have other shapes, such as a polygon (not shown).

Figure 2C:
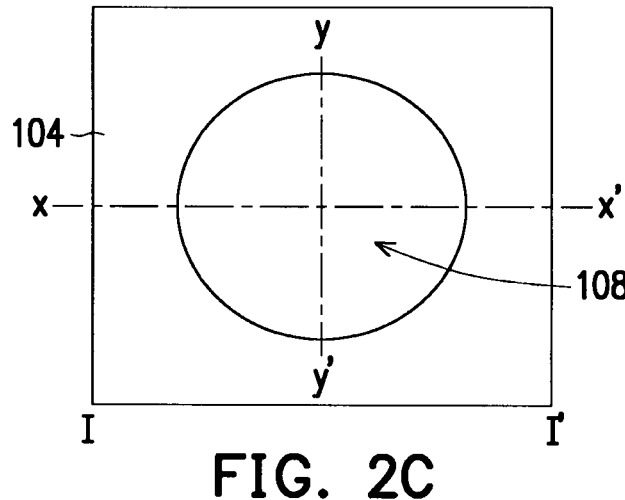
Figure 3C:
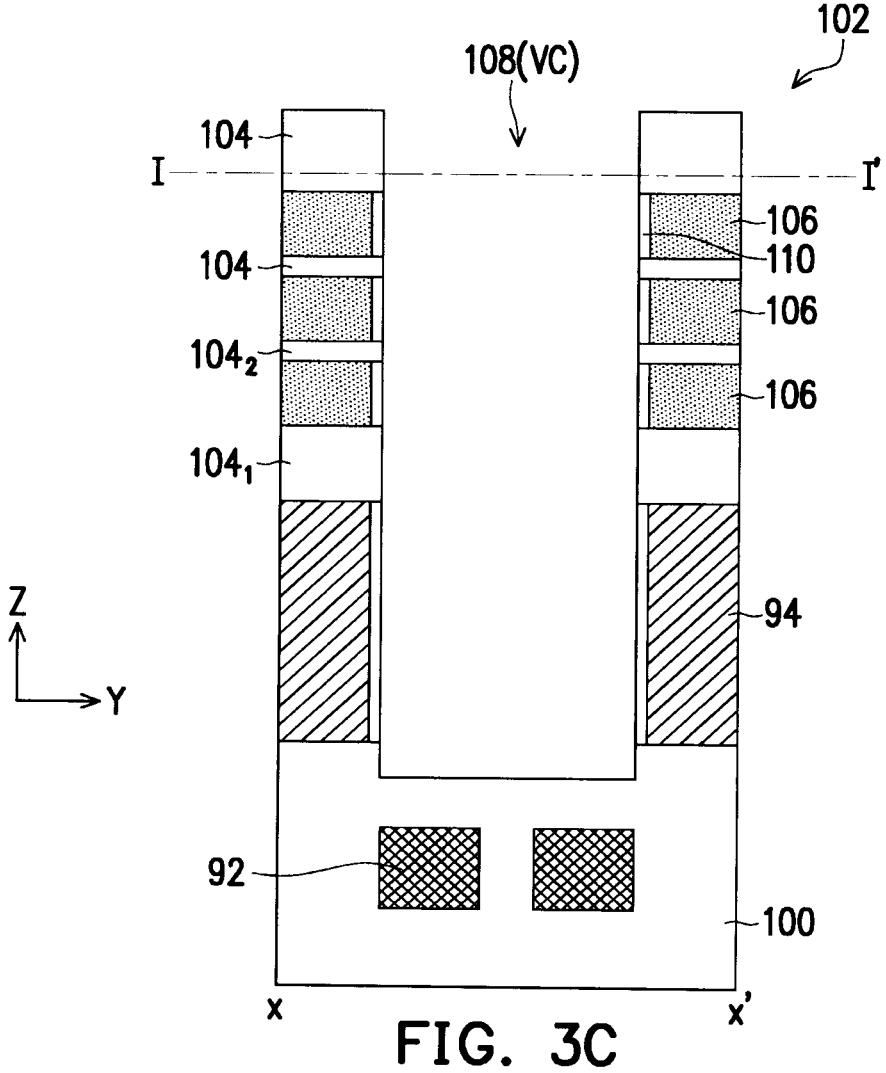

Referring to FIG. 2C and FIG. 3C, a thermal oxidation process is performed so that the surfaces of the sidewalls of the intermediate layers 106 exposed by the opening 108 are oxidized to form a protection layer 110. The material of the protection layer 110 is silicon oxide, for example.

Figure 2D:
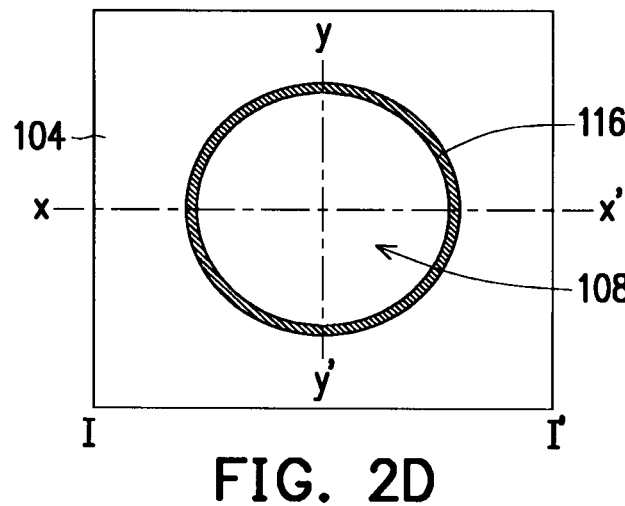
Figure 3D:
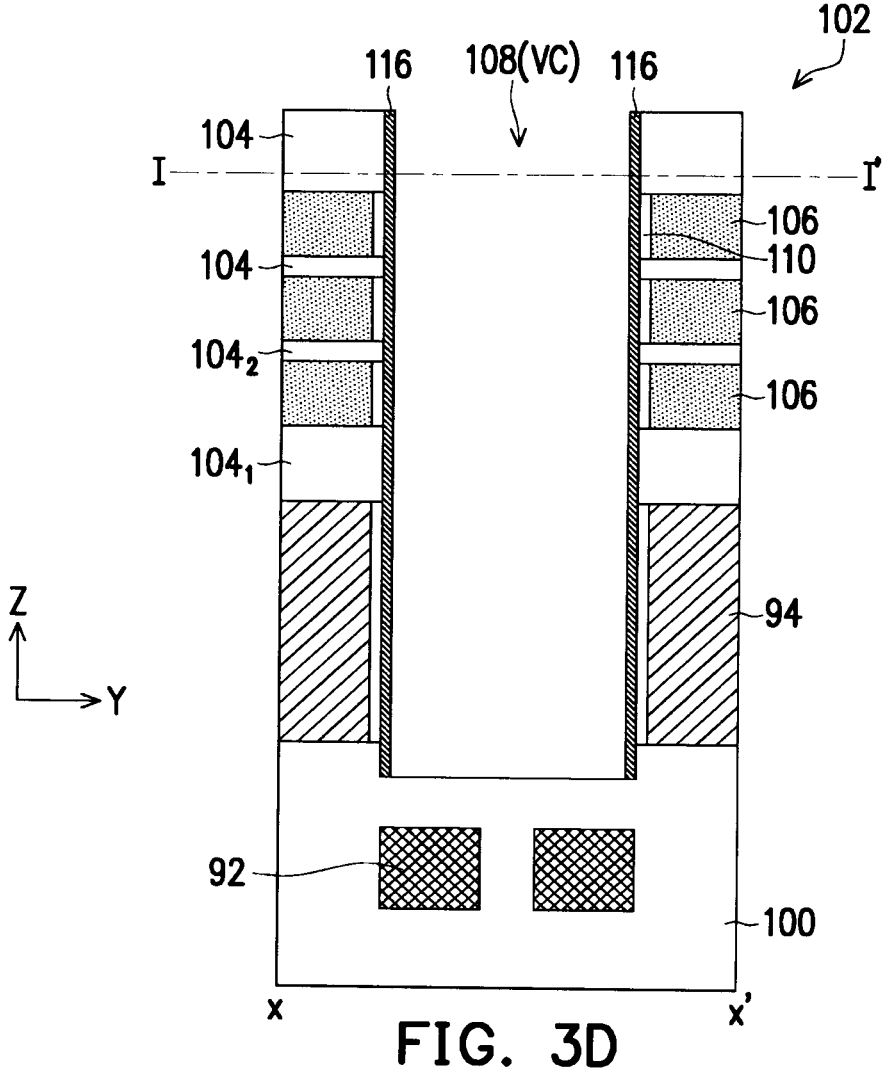

Referring to FIG. 2D and FIG. 3D, a channel pillar 116 is formed on the sidewall of the opening 108. The material of the channel pillar 116 may be a semiconductor material, such as undoped polysilicon. The channel pillar 116 is formed by, for example, forming a channel material on the stacked structure 102 and in the opening 108. Afterwards, an etch-back process is performed to partially remove the channel material to form the channel pillar 116. From the top view, the channel pillar 116 is, for example, in ring shape, and the channel pillar 116 may be continuous in the extending direction (e.g., in the direction perpendicular to the dielectric substrate 100) thereof. That is to say, the channel pillar 116 is integral in the extending direction thereof, and is not divided into multiple disconnected parts. In some embodiments, the channel pillar 116 may have a circular shape from the top view, but the disclosure is not limited thereto. In other embodiments, the channel pillar 116 may also have other shapes (such as polygons) from the top view.

Figure 2E:
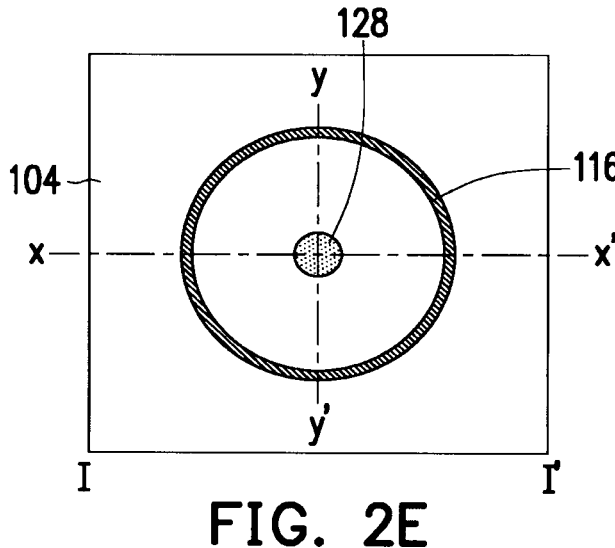
Figure 3E:
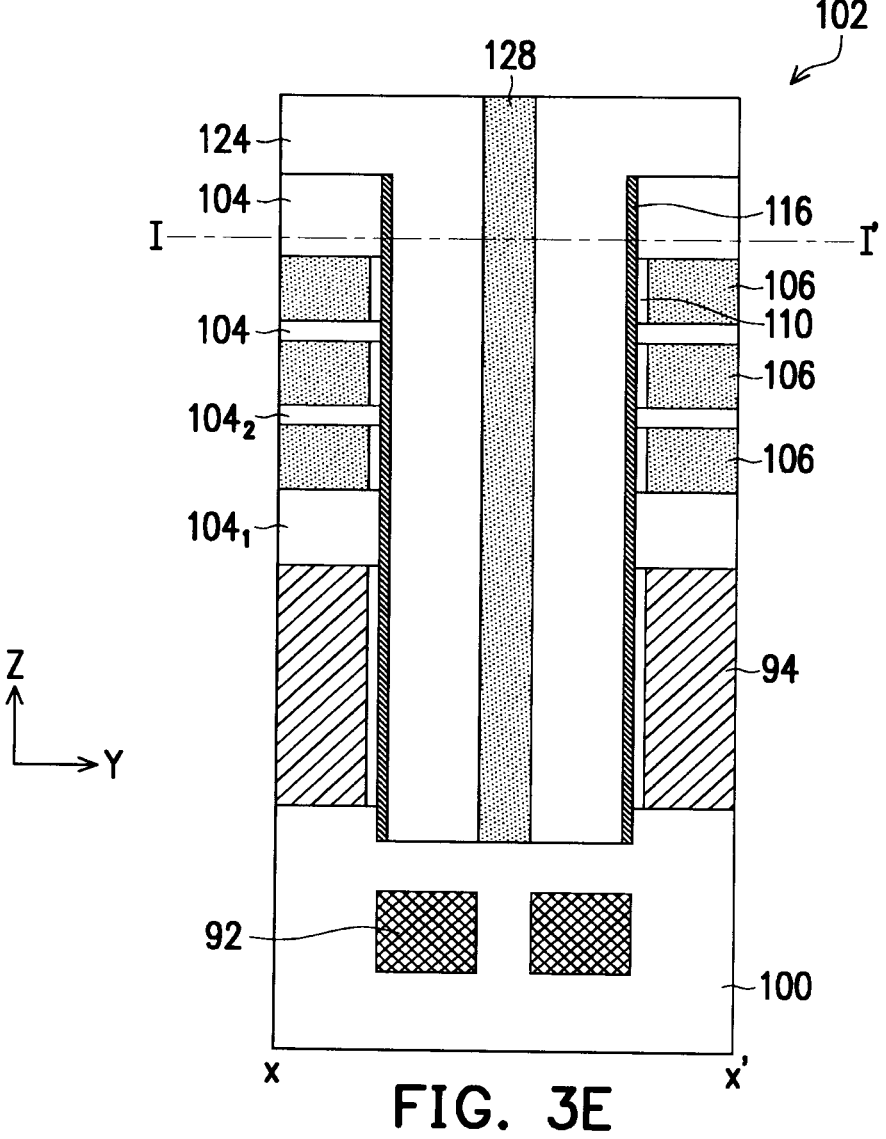

Referring to FIG. 2E and FIG. 3E, an insulating filling layer 124 is formed above the stacked structure 102 and in the opening 108. The material of the insulating filling layer 124 is, for example, silicon oxide. During the insulating filling layer 124 fills the opening 108, when the center of the opening 108 is not completely filled and a hole is left, an insulating material different from the insulating filling layer 124 is filled (such as silicon nitride), and the opening 108 is completely sealed. After the insulating material is etched back to expose the surface of the insulating filling layer 124 through the dry etching or wet etching process, the insulating material remaining in the center of the opening 108 forms the insulating pillar 128.

Figure 2F:
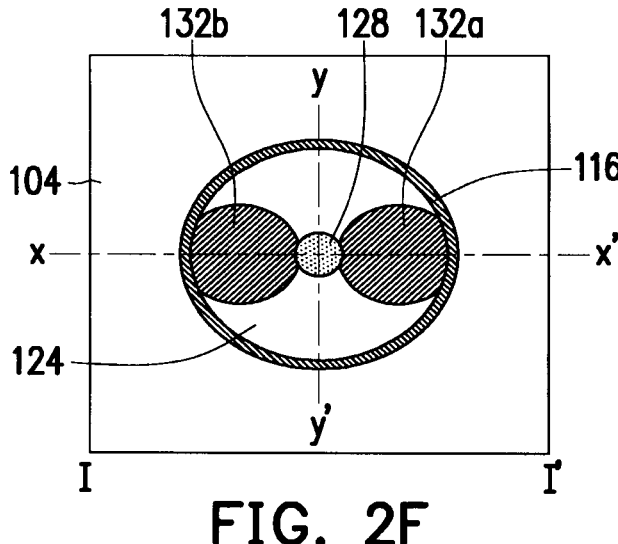
Figure 3F:
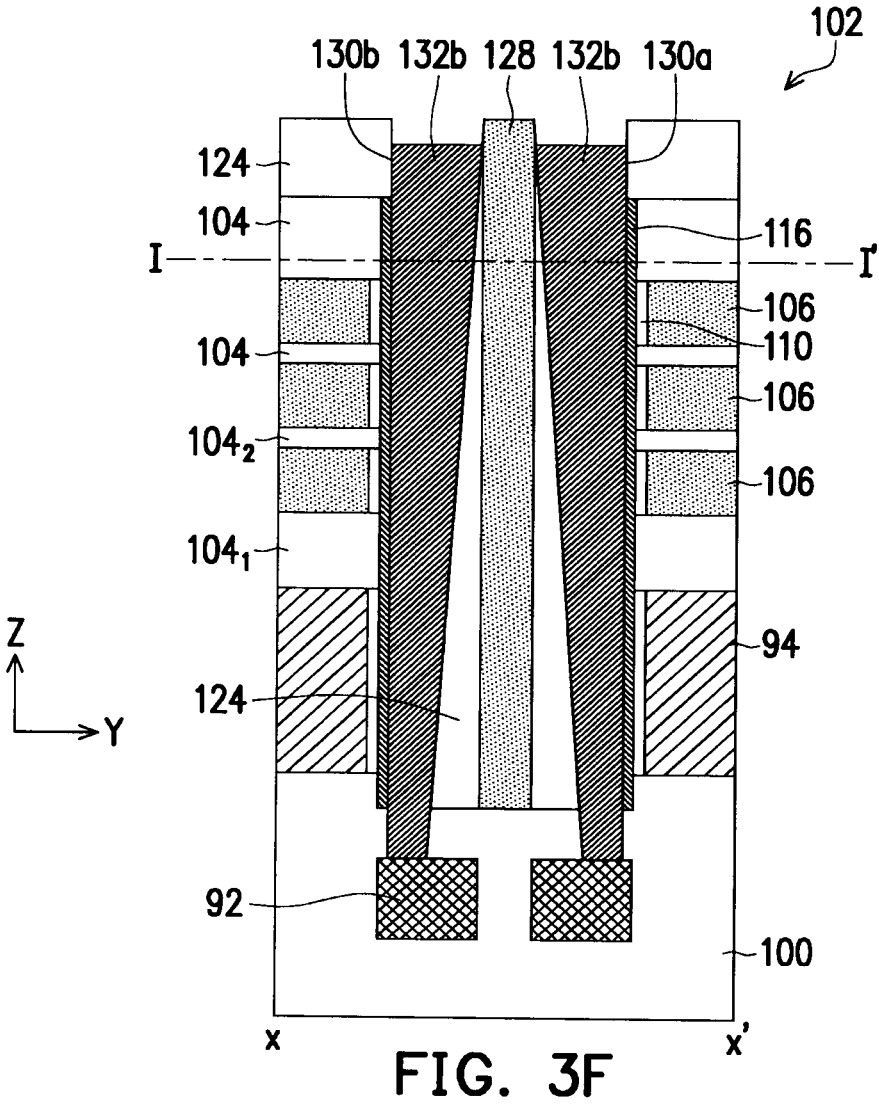

Referring to FIG. 2F and FIG. 3F, a patterning process is performed to form a hole 130a and a hole 130b in the insulating filling layer 124. The holes 130a and 130b extend from the top surface of the insulating filling layer 124 to the dielectric substrate 100. The pattern shape of the hole defined by the patterning process may be tangent to the shape of the insulating pillar 128. The pattern shape of the hole defined by the patterning process may also exceed the shape of the insulating pillar 128. Since the etching rate of the insulating pillar 128 is lower than that of the insulating filling layer 124, the insulating pillar 128 is hardly damaged by etching and remains. A first conductive pillar 132a and a second conductive pillar 132b are formed in the hole 130a and the hole 130b. The first conductive pillar 132a and the second conductive pillar 132b may be used as a source pillar and a drain pillar respectively, and are electrically connected to the channel pillar 116 respectively. The first conductive pillar 132a and the second conductive pillar 132b may be formed by forming a conductive layer on the insulating filling layer 124 and in the holes 130a and 130b, and then etching back. The first conductive pillar 132a and the second conductive pillar 132b are, for example, doped polysilicon.

Figure 2G:
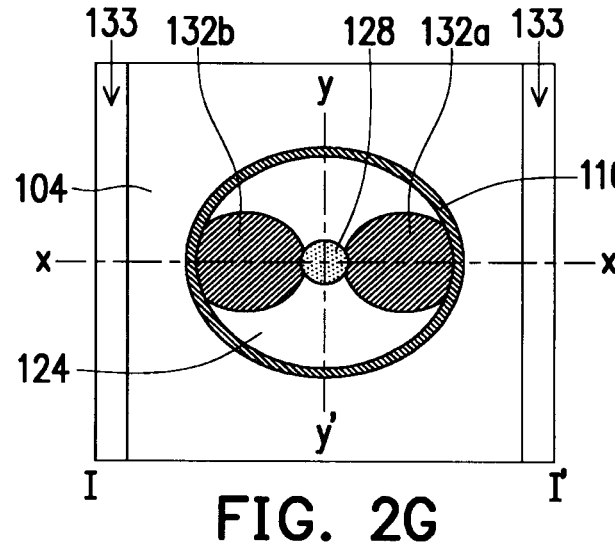
Figure 3G:
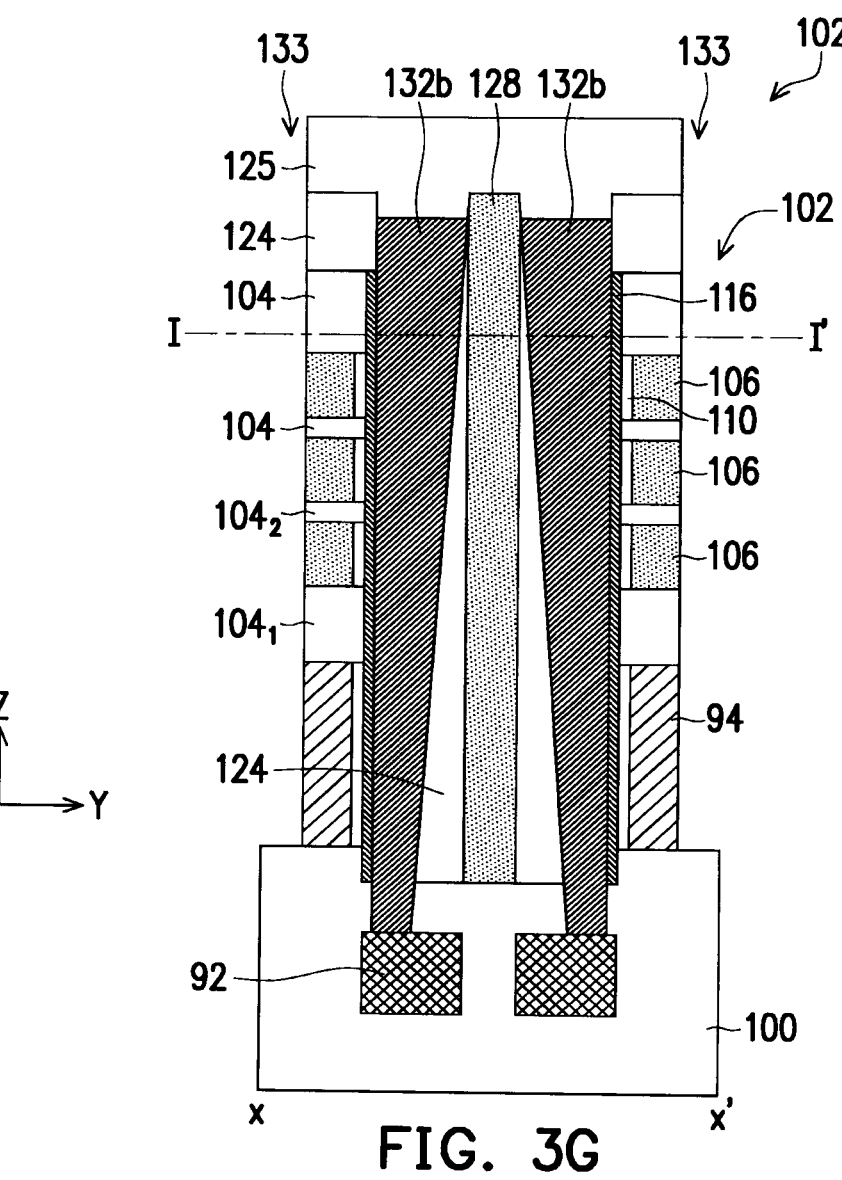

Referring to FIG. 2G and FIG. 3G, a dielectric layer 125 is formed on the insulating filling layer 124, the first conductive pillar 132a, the second conductive pillar 132b, and the insulating pillar 128. The material of the dielectric layer 125 include silicon oxide, silicon nitride, silicon oxynitride, or combinations thereof. Next, a patterning process is performed to form a plurality of slit trench 133. The slit trench 133 extends along X direction to divide the stacked structure 102 and the conductive layer 94 into a plurality of blocks. The slit trench 133 extends from the dielectric layer 125 down through the stacked structure 102 and further extends to the conductive layer 94. The bottom part of the slit trench 133 may expose the dielectric substrate 100 or a portion of the conductive layer 94 (not shown).

Figure 2H:
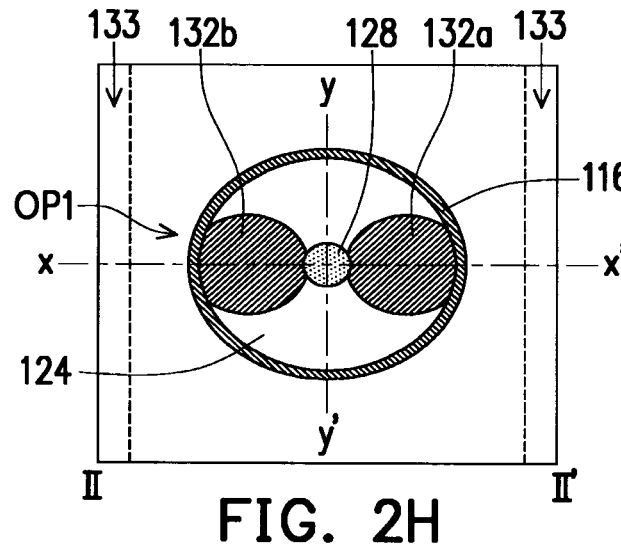
Figure 3H:
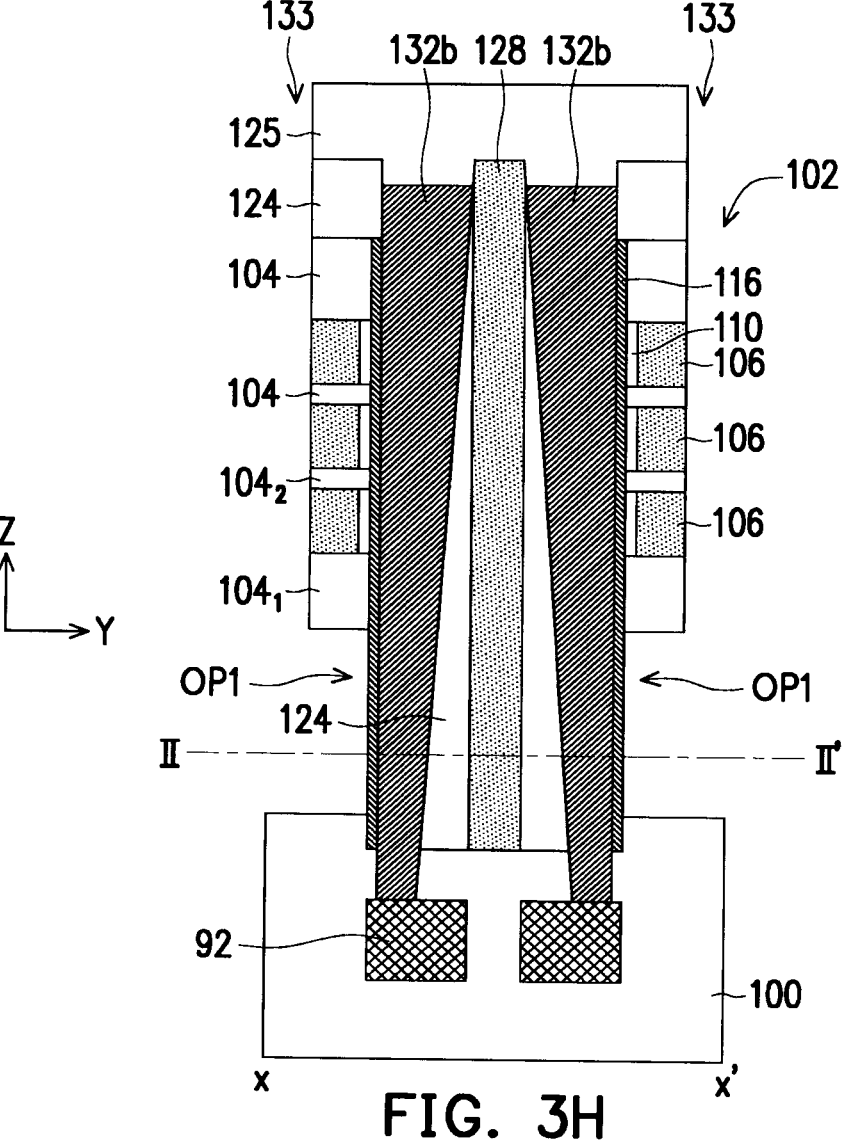
Figure 3I:
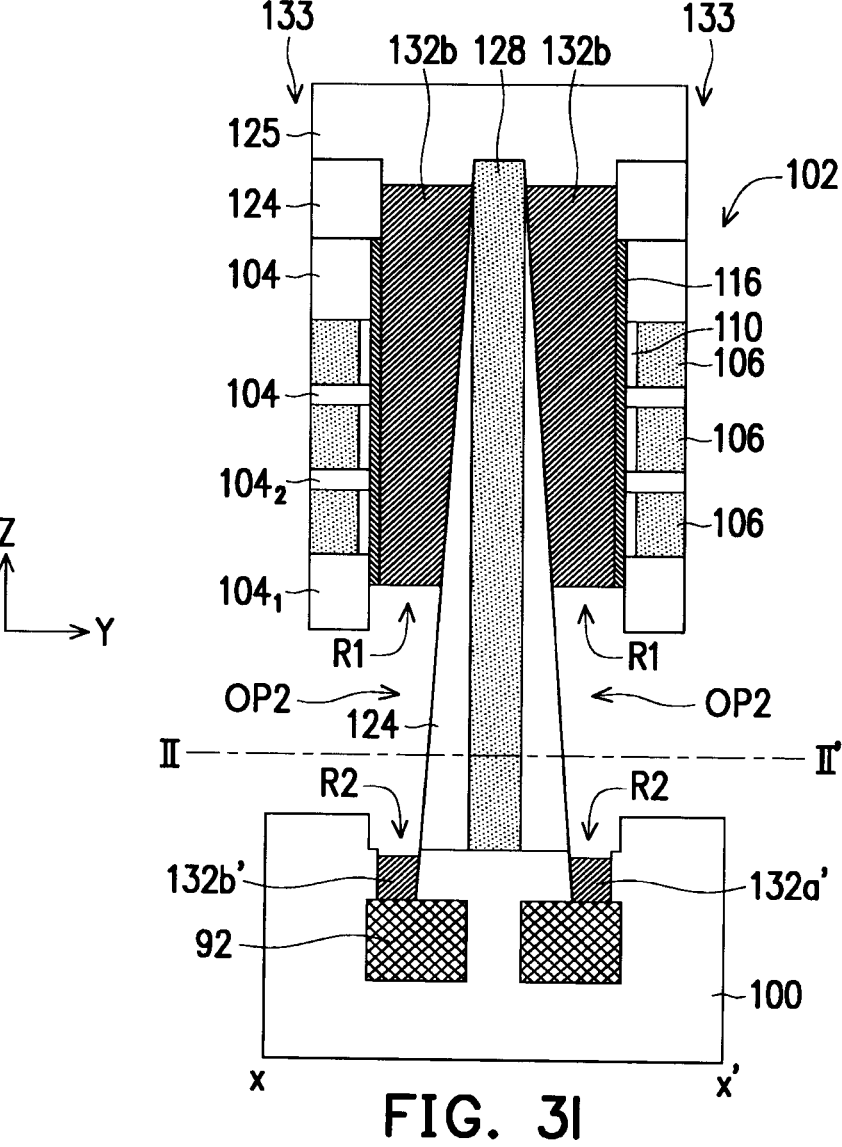
Figure 31:
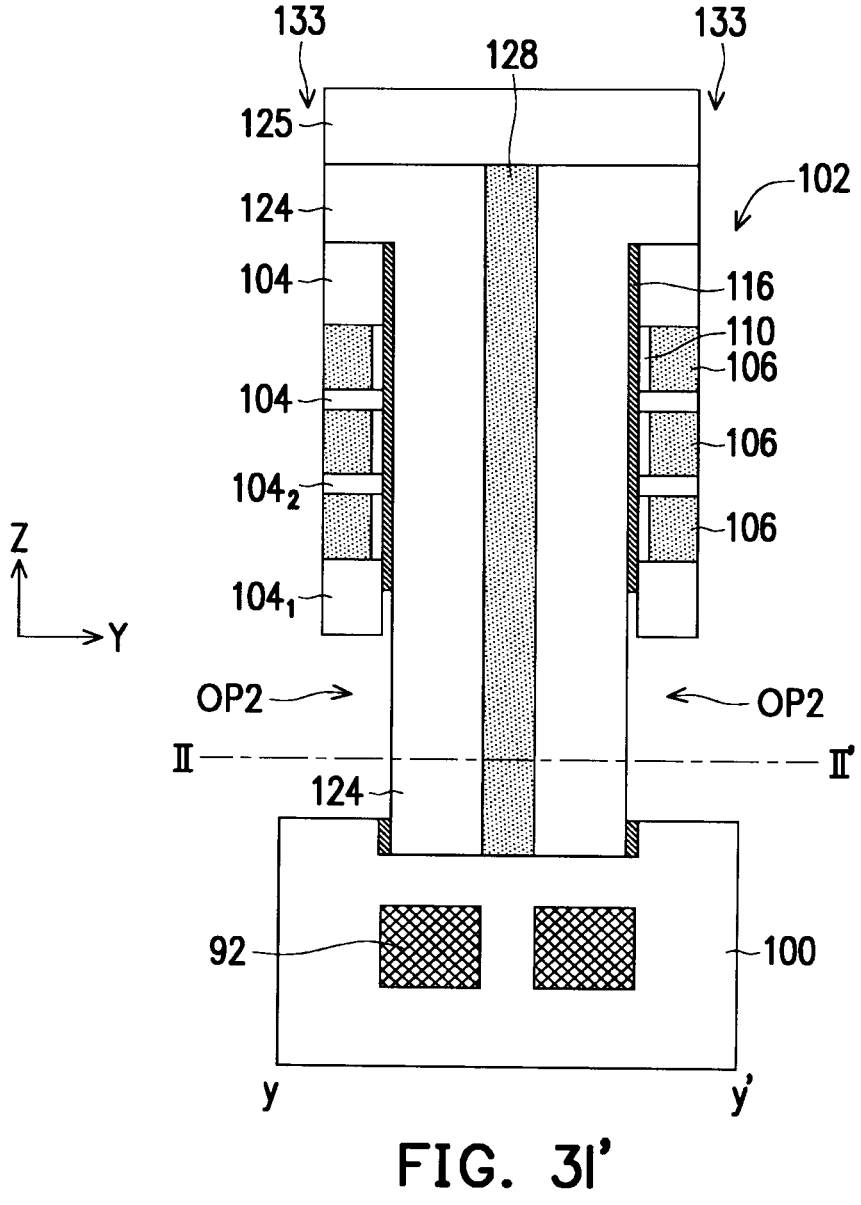

Referring to FIG. 2H and FIG. 3H, an etching process, such as a wet etching process, is performed to remove the conductive layer 94 and the protection layer 110 on the sidewall of the conductive layer 94 to form a horizontal opening OP1. The horizontal opening OP1 exposes the outer wall of the channel pillar 116.

Figure 2I:
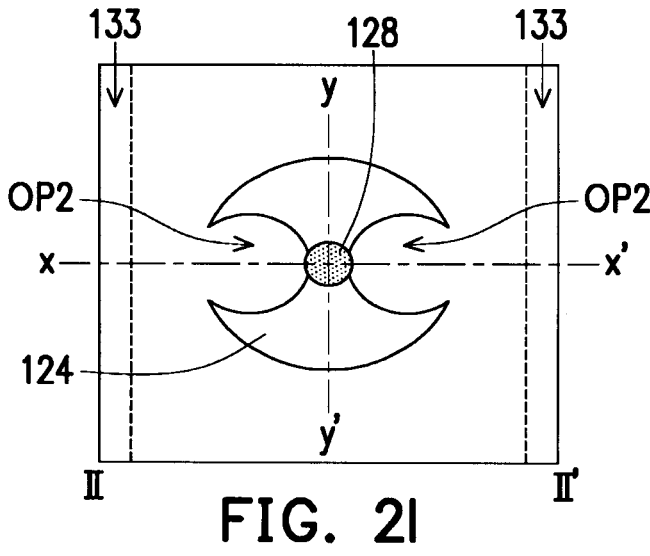

Referring to FIG. 2I, FIG. 3I and FIG. 3I', an etching process, such as a wet etching process, is performed to remove a portion of the channel pillar 116, a portion of the first conductive pillar 132a and a portion of the second conductive pillar 132b to form a horizontal opening OP2. The horizontal opening OP2 exposes the insulating filling layer 124. When performing the etching process, the main etching process is performed first, and then the over-etching process is performed to remove more of the channel pillar 116, the first conductive pillar 132a, and the second conductive pillar 132b, so that the horizontal opening OP2 has grooves R1 and R2. The groove R1 extends upwards to between the top surface and the bottom surface of the bottommost insulating layer 104, exposes the bottom surfaces of the remaining channel pillar 116, first conductive pillar 132a and second conductive pillar 132b. The bottom surfaces of the first conductive pillar 132a and the second conductive pillar 132b are located between the top surface and the bottom surface of the bottommost insulating layer 104₁. The groove R2 extends down into the dielectric substrate 100, exposes the remaining first conductive pillar 132a' and second conductive pillar 132b'.

Figure 2J:
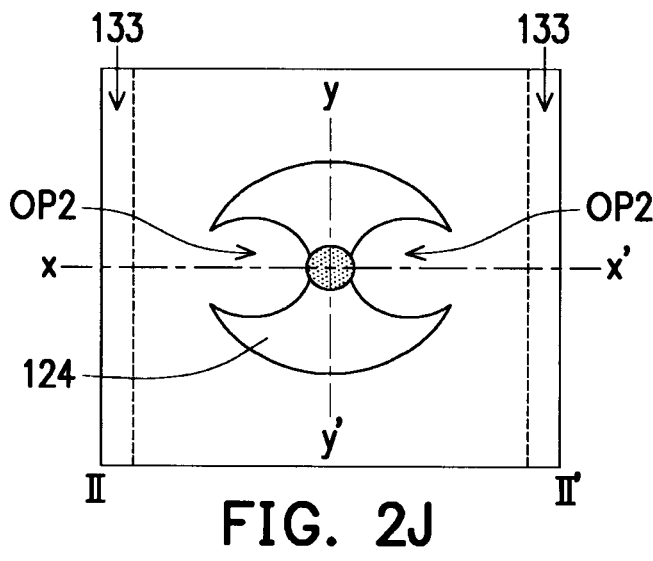
Figure 3J:
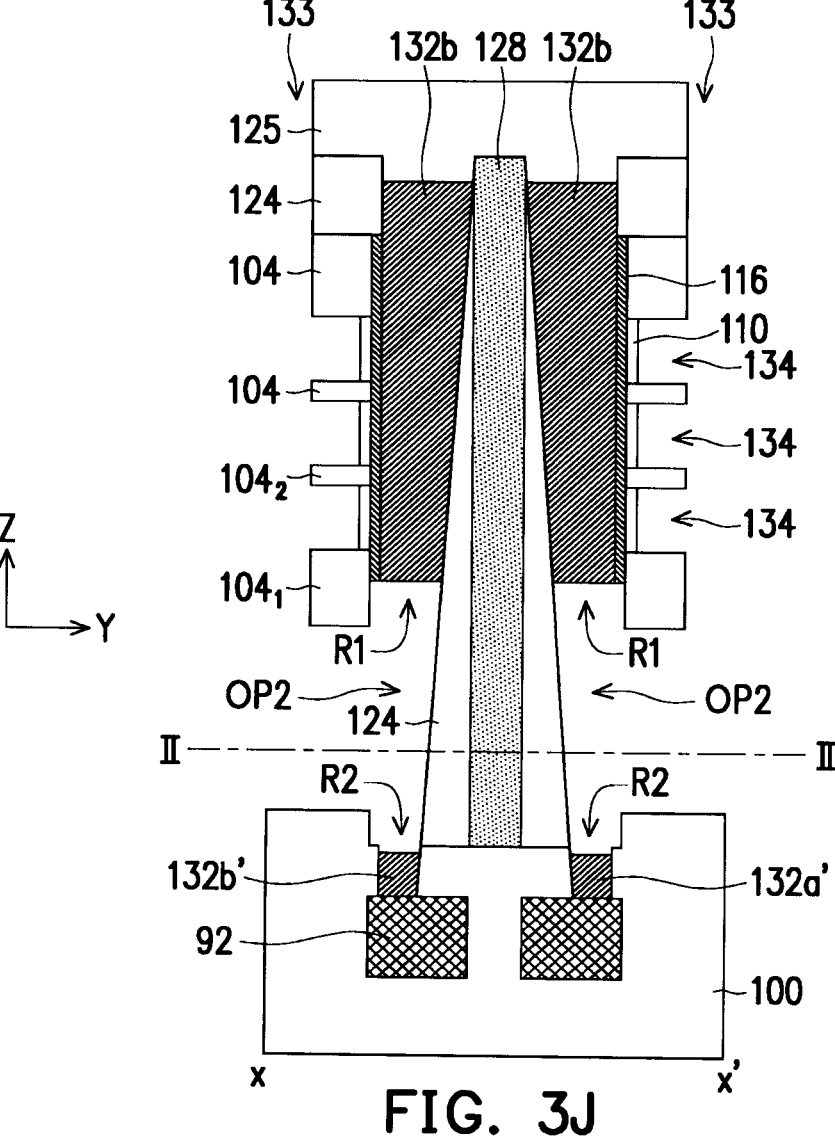
Figure 3J:
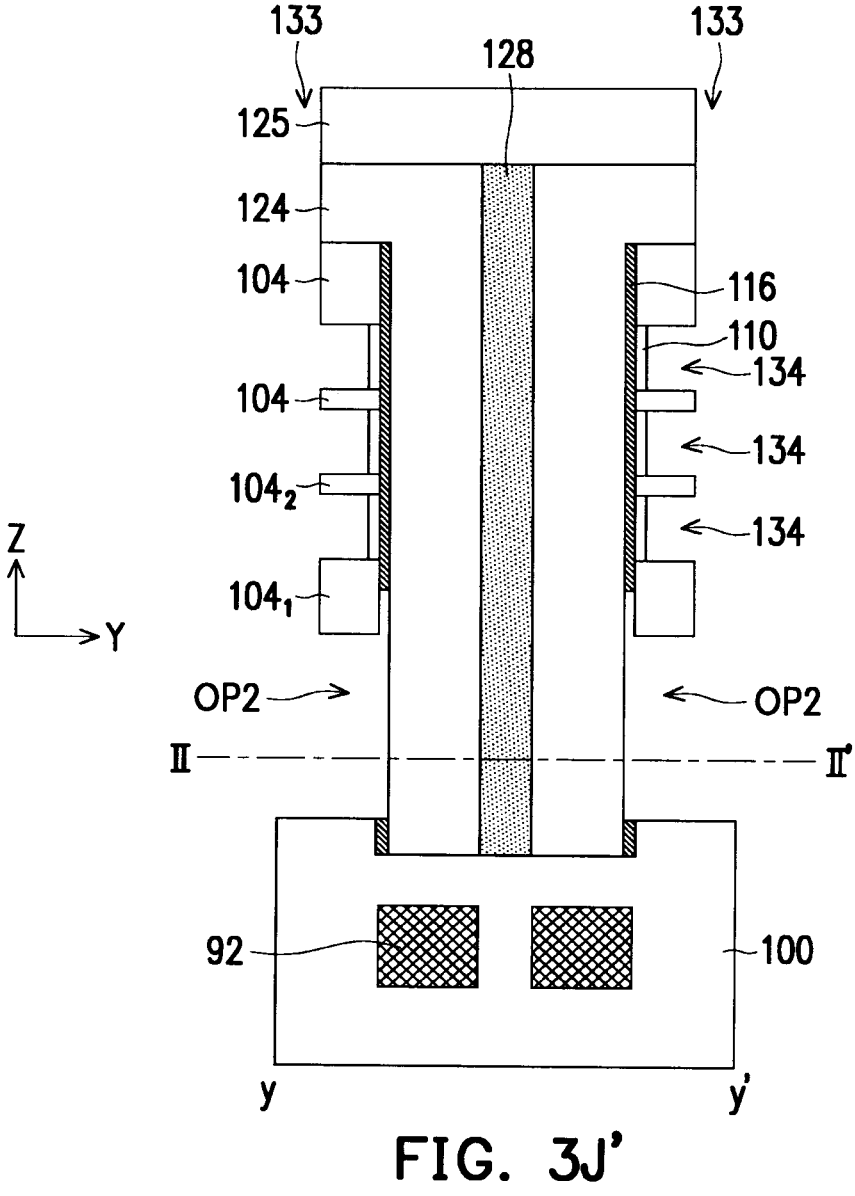

Referring to FIG. 2J, FIG. 3J and FIG. 3J', a gate replacement process is performed. First, an etching process, such as a wet etching process, is performed to remove the intermediate layers 106 to form a plurality of horizontal openings 134. The plurality of horizontal openings 134 expose the protection layer 110. During the etching process, since the materials of the protection layer 110 and the intermediate layer 106 are different, the protection layer 110 can be used as an etching stop layer to protect the channel pillar 116.

Figure 2K:
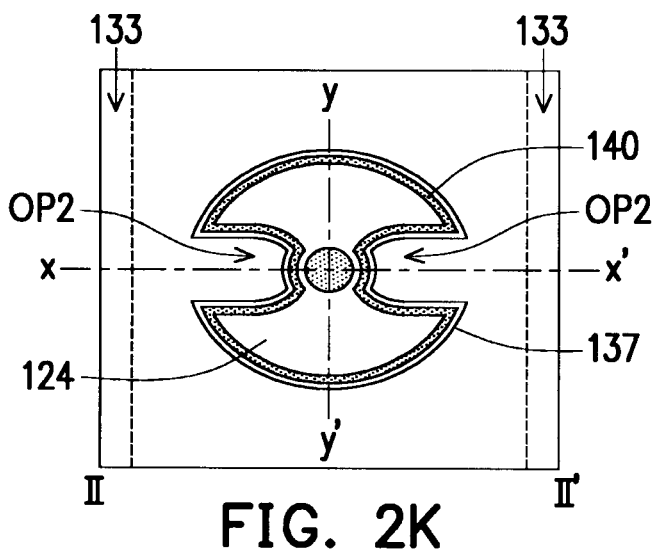
Figure 3K:
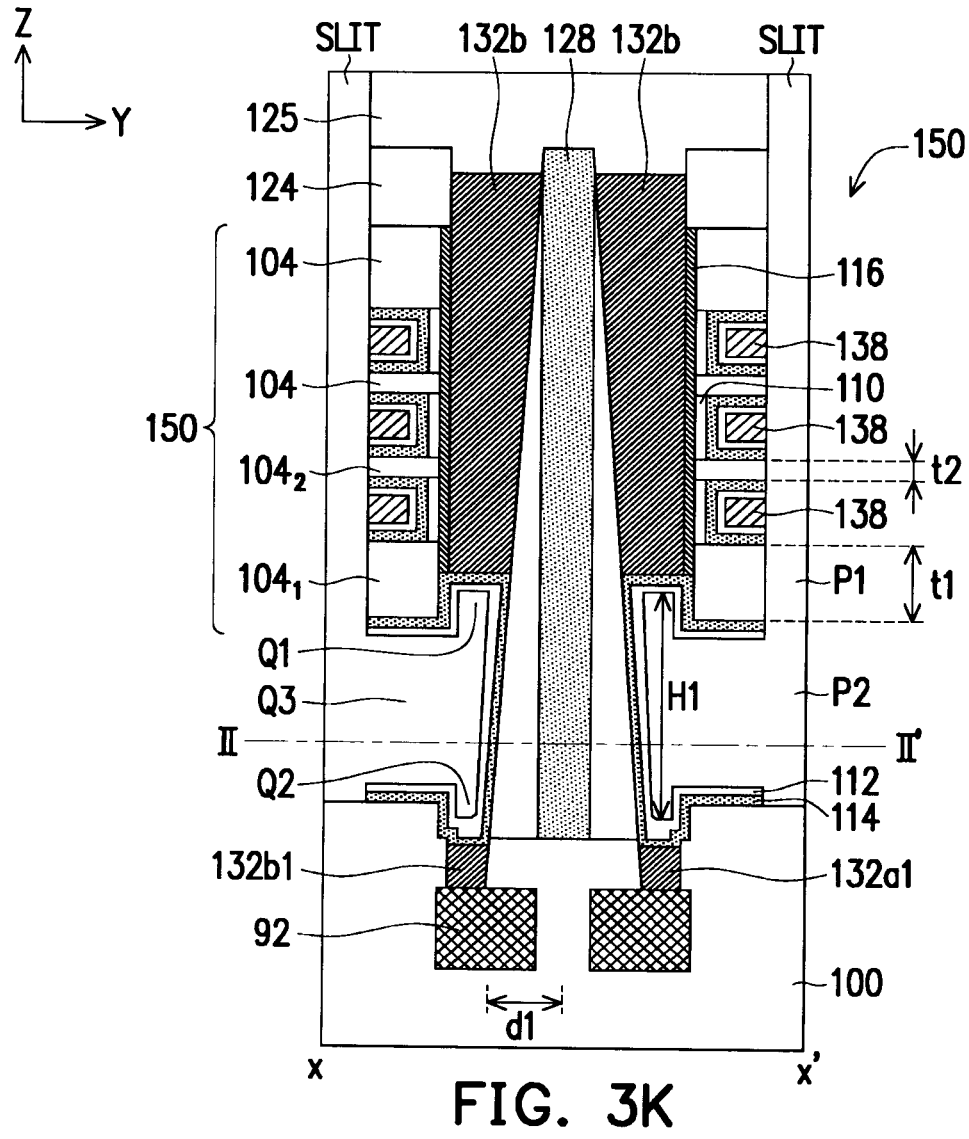
Figure 3K:
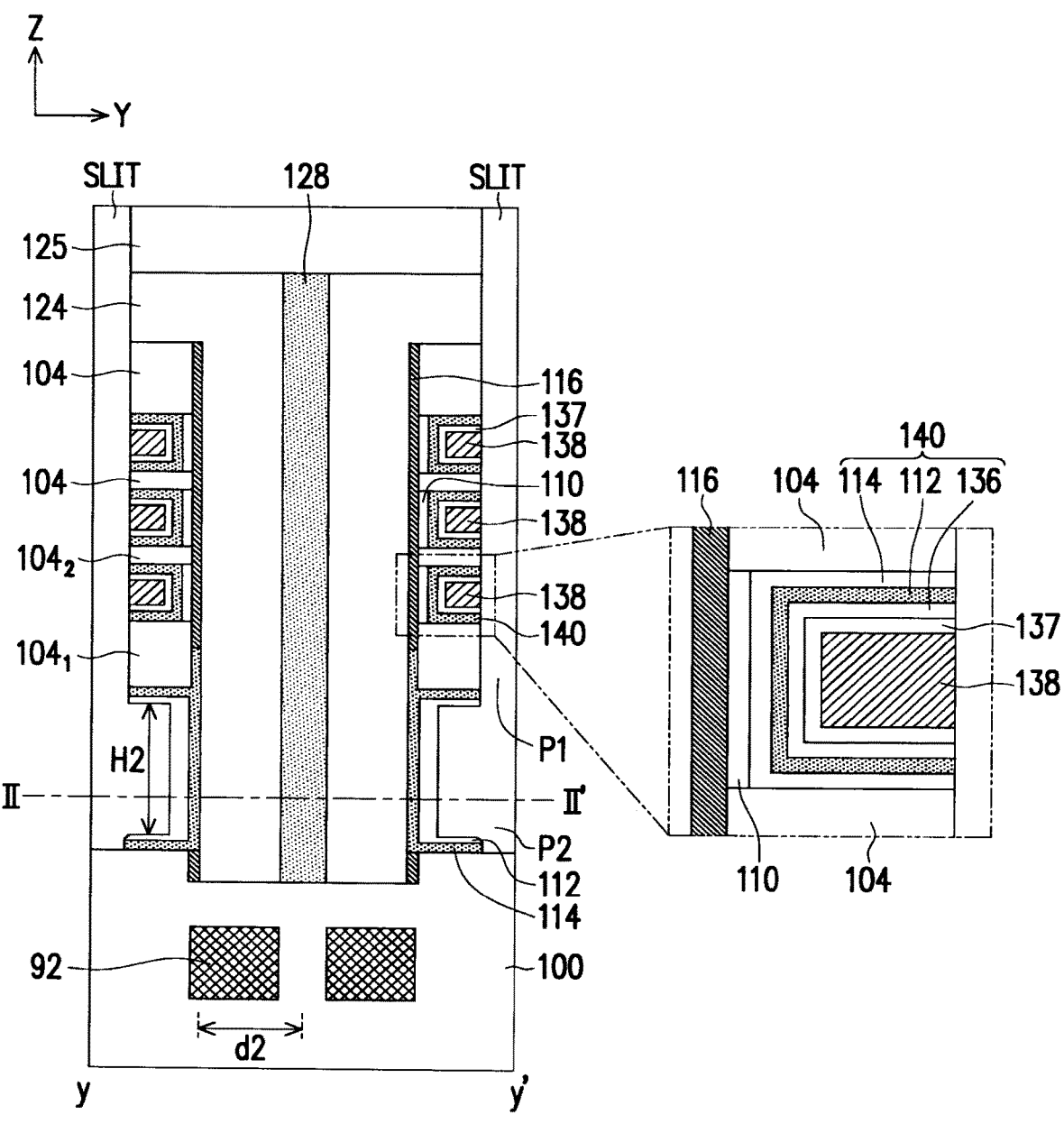

Referring to FIG. 2K, FIG. 3K and FIG. 3K', a tunneling layer 114, a charge storage layer 112, a blocking layer 136, a barrier layer 137 and a conductive layer 138 are formed in the plurality of horizontal openings 134. The tunneling layer 114 and the charge storage layer 112 are also formed in the horizontal opening OP2. The tunneling layer 114, the charge storage layer 112, the blocking layer 136, the barrier layer 137, and the conductive layer 138 are formed by, for example, forming a tunneling material, a charge storage material, a blocking material, a barrier material and conductive material in the plurality of slit trenches 133, the plurality of horizontal openings 134 and OP2. Afterwards, an etch-back process is performed to remove the conductive material, the barrier material and the blocking material in the plurality of slit trenches 133 and the horizontal opening OP2, so as to form the conductive layer 138, the blocking layer 136 and the barrier layer 137 in the horizontal openings 134.

Next, another etching process is performed to remove the charge storage material and the tunneling material in the plurality of slit trenches 133 to form the charge storage layer 112 and the tunneling layer 114 in the horizontal openings 134 and OP2. So far, the gate stacked structure 150 is formed. The gate stacked structure 150 is disposed on the dielectric substrate 100 and includes a plurality of gate layer 138 and a plurality of insulating layer 104 stacked alternately.

Thereafter, a slit SLIT is formed in the plurality of slit trenches 133. The forming method of the slit SLIT includes filling the insulating material on the gate stacked structure 150 and the slit trenches 133, and then removing the excess insulating material on the gate stacked structure 150 through an etch-back process or a planarization process. The insulating material is silicon oxide or silicon nitride. In other embodiments, the slit SLIT may include a conductive layer and an insulating liner covering the outer sidewall of the conductive layer. In some other embodiments, the slit SLIT may also include an insulating layer with an air gap therein.

In an embodiment of the present disclosure, the slit SLIT includes a body part P1 and an extension part P2. The body part P1 extends in the third direction Z, passes through the stacked structure 150, and separates the conductive layers 138 of the adjacent blocks. The extension part P2 is connected with the body part P1 and is located between the stacked structure 150 and the dielectric substrate 100. The extension part P2 is covered by the tunneling layer 114 and the charge storage layer 112. The extension part P2 is separated the first conductive pillar 132a and the second conductive pillar 132b by the tunneling layer 114 and the charge storage layer 112. The extension part P2 is separated the remaining first conductive pillar 132a1 and the remaining second conductive pillar 132b1 by the tunneling layer 114 and the charge storage layer 112.

The height H1 of the extension part P2 in the first direction X is greater than the height H2 of the extension part P2 in the second direction Y. The extension part P2 includes a first protrusion part Q1, a second protrusion part Q2 and an intermediate part Q3. The intermediate part Q3 is between the first protrusion part Q1 and the second protrusion part Q2, and is connected to both. The first protrusion part Q1 and the second protrusion part Q2 are fitted with the first conductor post 132a, the second conductor post 132b, the remaining first conductor post 132a1 and the remaining second conductor post 132b1. The first protrusion part Q1 and the second protrusion part Q2 extend in opposite directions. The first protrusion part Q1 extends toward the channel pillar 116. The top surface of the first protrusion part Q1 is located between the top surface and the bottom surface of the bottommost insulating layer $104_1$. The second protrusion part Q2 extends toward the dielectric substrate 100.

The cross section of the extension part P2 in the first plan XZ is, for example, a horizontal T-shape, as shown in FIG. 3K. The cross section of the extension part P2 in the second plan YZ is, for example, rectangular, as shown in FIG. 3K'. The top view of the extension part P2 is semicircular or semielliptical, as shown in FIG. 2K. The first distance d1 between the extension part P2 and the insulating pillar 128 in first direction X is smaller than the second distance d2 between the extension part P2 and the insulating pillar 128 in second direction Y. The thickness t1 of the bottommost insulating layer $104_1$ is greater than the thickness t2 of the insulating layer $104_2$ between the plurality of conductive layers 138.

In the above embodiments, there is a single conductive layer 94 underneath the stacked structure 102. However, the present disclosure is not limited thereto. In other embodiments, a plurality of conductive layers 94a, 94b can be arranged under the stacked structure 102 and separated by an insulating layer 104. The manufacturing process is shown in FIG. 4A to FIG. 4D.

FIG. 4A to FIG. 4D are cross-sectional views of a method of fabricating a memory device according to another embodiment of the present disclosure.

Figure 4A:
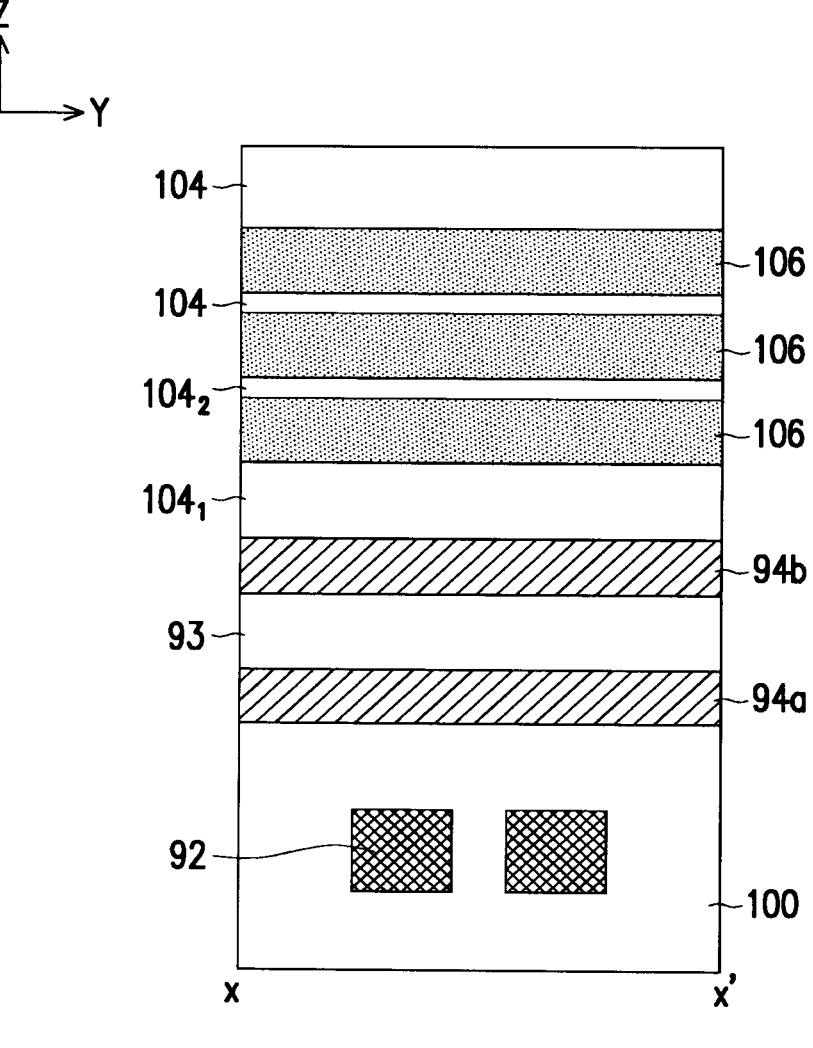
FIG. 4A to FIG. 4D are cross-sectional views of a method of fabricating a memory device according to another embodiment of the present disclosure.

Referring to FIG. 4A, a conductive layer 94a, an insulating layer 93, and a conductive layer 94b are formed on a dielectric substrate 100. The conductive layers 94a, 94b are, for example, semiconductor materials. The insulating layer 93 is made of silicon oxide, for example. Next, a stacked structure 102 is formed on the conductive layer 94b.

Figure 4B:
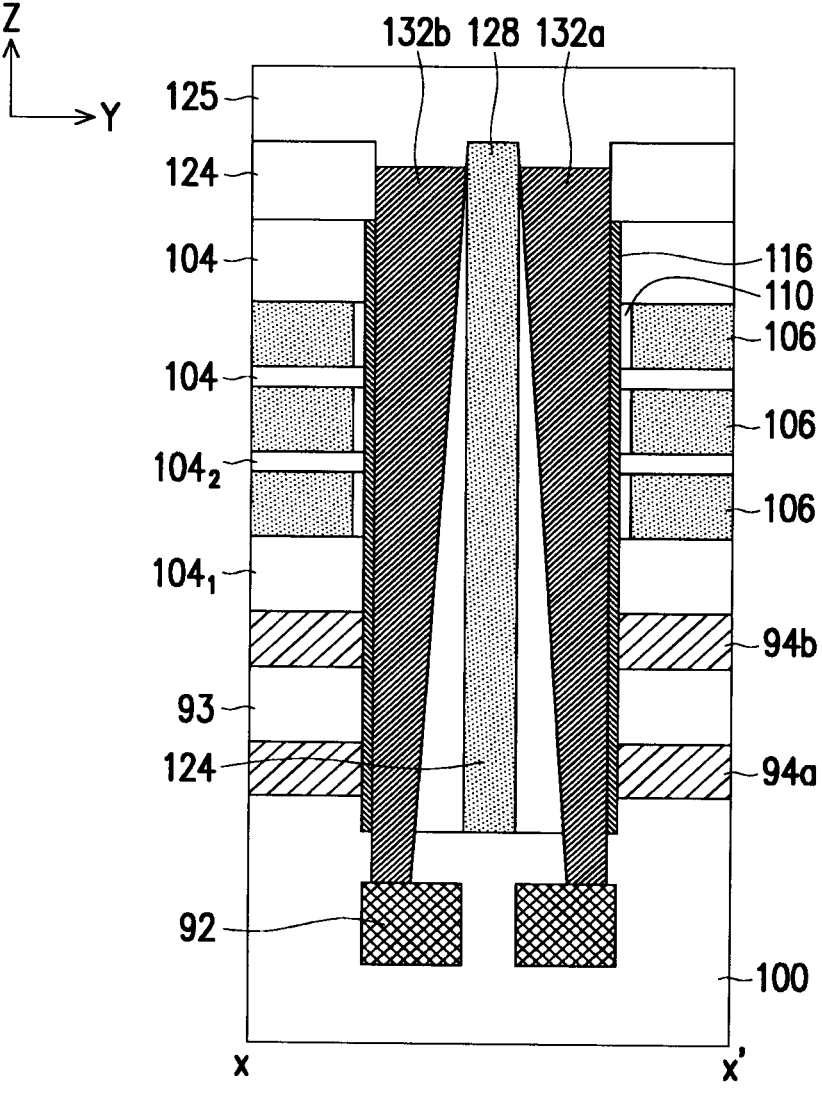

Referring to FIG. 4B, the insulating filling layer 124, the insulating pillar 128, the first conductive pillar 132a, the second conductive pillar 132b, and the dielectric layer 125 are formed according to the method described above.

Figure 4C:
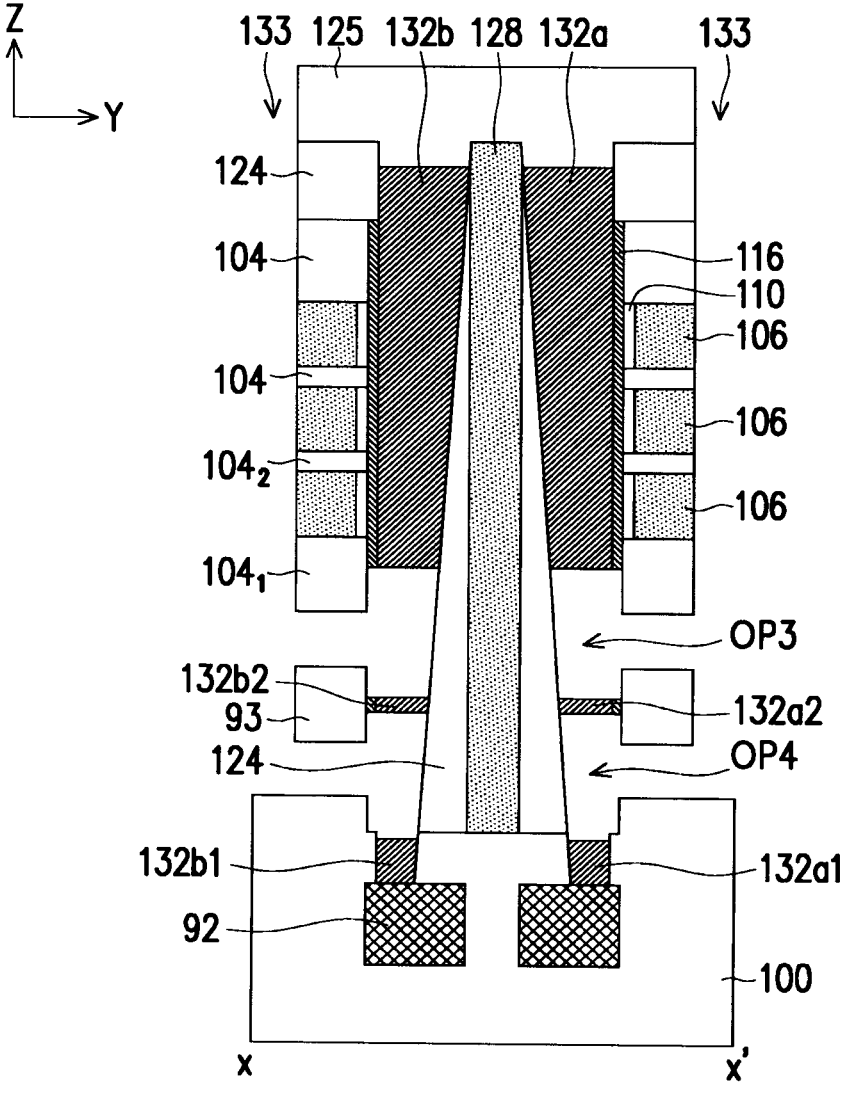

Referring to FIG. 4C, a patterning process is performed to form a plurality of slit trenches 133. Next, an etching process is performed to remove the protection layer 110, the conductive layers 94a and 94b, a portion of the channel pillar 116, a portion of the first conductive pillar 132a and a portion of the second conductive pillar 132b, so as to form horizontal openings OP3 and OP4, and leave the remaining first conductive pillar 132a2 and the remaining second conductive pillar 132b2 between the horizontal opening OP3 and the horizontal opening OP4, and leave the remaining first conductive pillar 132a1 and the remaining second conductive pillar 132b1 under the horizontal opening OP4.

Figure 4D:
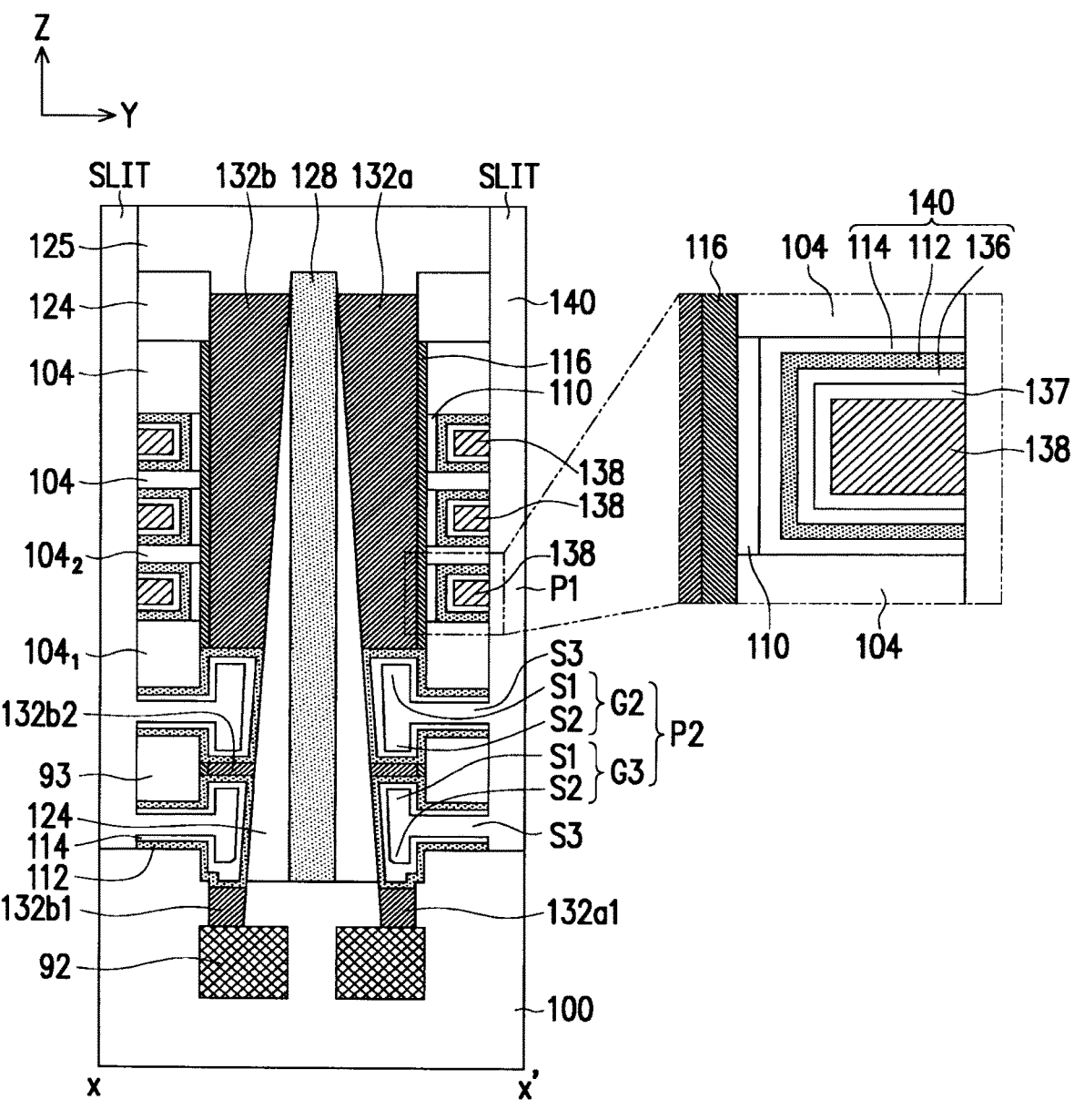

Referring to FIG. 4D, the gate replacement process is performed according to the above method to replace the intermediate layers 106 with the tunneling layer 114, the charge storage layer 112, the blocking layer 136, the barrier layer 137 and the conductive layer 138. Similarly, the tunneling layer 114 and the charge storage layer 112 are also formed in the horizontal openings OP3 and OP4. Afterwards, the slit SLIT is formed in the plurality of slit trenches 133.

In this embodiment, the slit SLIT includes a body part P1 and an extension part P2. The body part P1 extends in the third direction Z, passes through the stacked structure 150, and separates the conductive layers 138 of the adjacent blocks. The extension part P2 includes a first part G2 and a second part G3. The first part G2 and the second part G3 are located between the stacked structure 150 and the dielectric substrate 100, and are connected to the body part P1. The first part G2 is located above the second part G3. The first part G2 and the second part G3 are separated from each other by the insulating layer 93, the remaining first conductive pillar 132a2 and the remaining second conductive pillar 132b2.

The cross sections of the first part G2 and the second part G3 are, for example, horizontal T shape. The first part G2 and the second part G3 may respectively include a first protrusion part S1, a second protrusion part S2 and an intermediate part S3. The intermediate part S3 is between the first protrusion part S1 and the second protrusion part S2, and is connected to both. The first protrusion part S1 extends toward the channel pillar 116. The top surface of the first protrusion part S1 is located between the top surface and the bottom surface of the bottommost insulating layer $104_1$. The second protrusion part S2 extends toward the dielectric substrate 100.

Figure 5A:
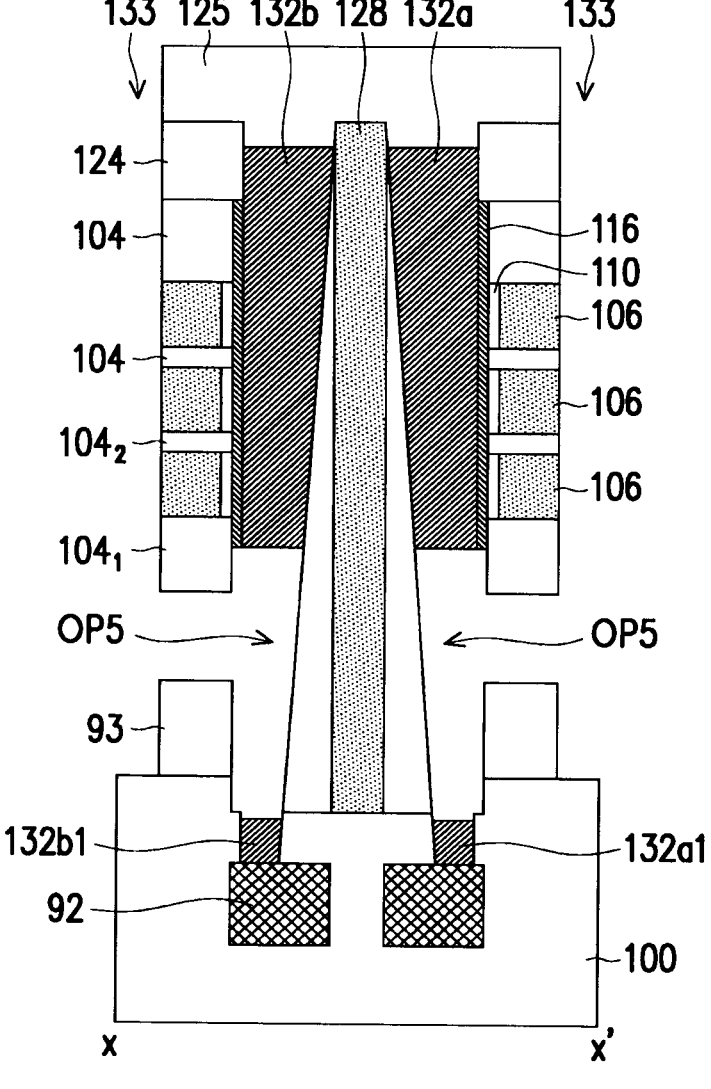
FIG. 5A to FIG. 5B are cross-sectional views of a method of fabricating a memory device according to yet another embodiment of the present disclosure.
Figure 5B:
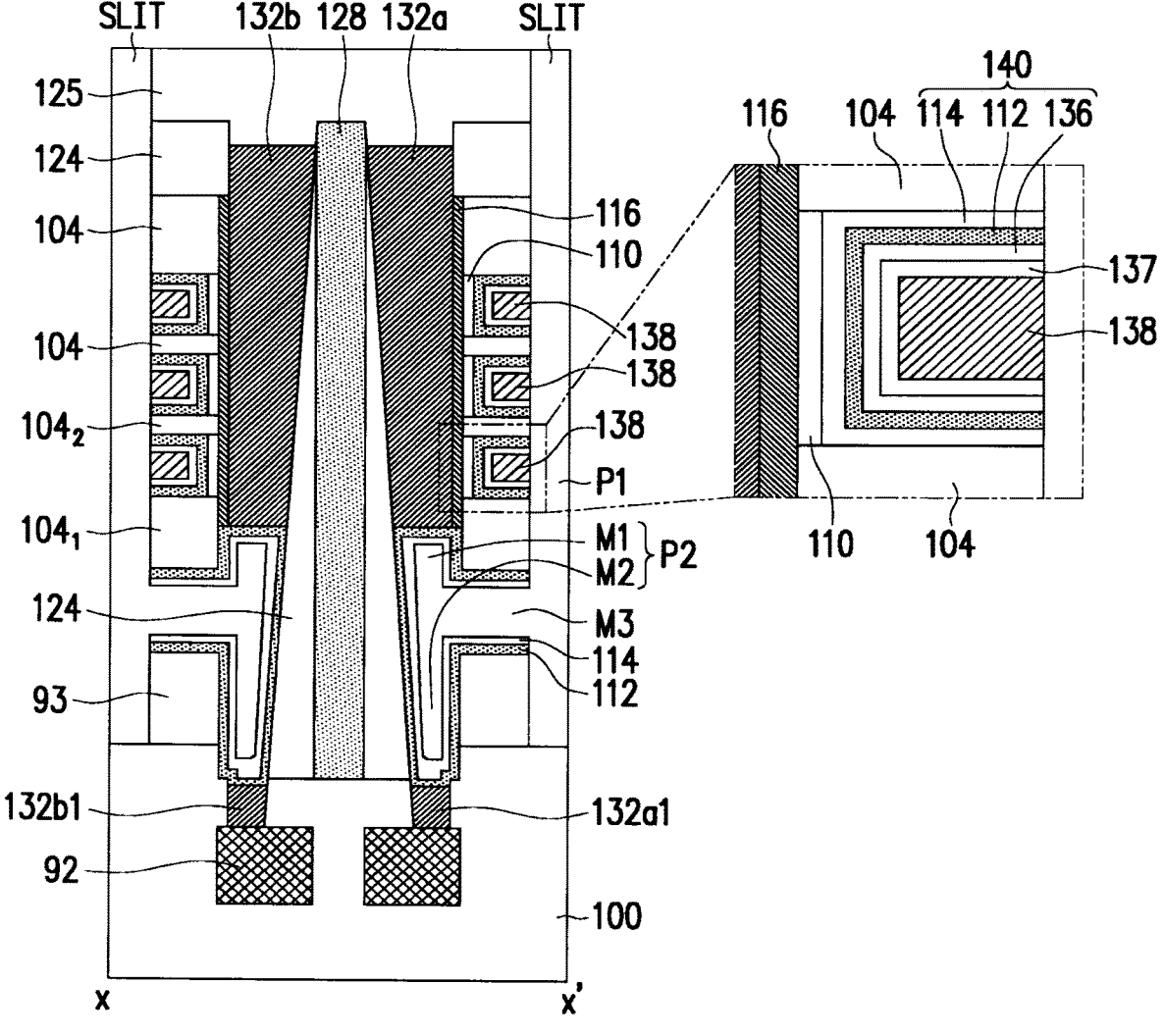

FIG. 5A to FIG. 5B are cross-sectional views of a method of fabricating a memory device according to yet another embodiment of the present disclosure.

Referring to FIG. 5A, in FIG. 4C, if there is no first conductive pillar 132a2 and second conductive pillar 132b2 left, and the insulating layer 93 is left in the dielectric substrate 100, a horizontal opening OP5 is formed, as shown in FIG. 5A.

Referring to FIG. 5B, following the above method until the slit SLIT is formed. The slit SLIT includes a body part P1 and an extension part P2. The body part P1 extends in the third direction Z and passes through the stacked structure 150. The extension part P2 is connected with the body part P1, and is located between the stacked structure 150 and the dielectric substrate 100. The cross section of the extension part P2 is, for example, a horizontal T shape. The extension part P2 includes a first protrusion part M1, a second protrusion part M2 and an intermediate part M3. The intermediate part M3 is between the first protrusion part M1 and the second protrusion part M2, and is connected to both. The first protrusion part M1 extends toward the channel pillar 116. The top surface of the first protrusion part M1 is located between the top surface and the bottom surface of the bottommost insulating layer $104_1$. The second protrusion part M2 extends toward the dielectric substrate 100.

To sum up, in the embodiment of the present disclosure, the memory device can avoid the problem of abnormal bridging between the conductive pillar and the conductive layer below the stacked gate by removing the conductive layer originally disposed below the stacked structure, and then reforming the insulating layer.

What is claimed is:

1. A memory device comprising:
   a stacked structure located on a dielectric substrate, wherein the stacked structure includes a plurality of conductive layers and a plurality of insulating layers stacked alternately;
   a channel pillar extending through the stacked structure;
   a plurality of conductive pillars located in the channel pillar and electrically connected with the channel pillar;
   a charge storage structure located between the plurality of conductive layers and the channel pillar;

a slit located in the stacked structure, wherein the slit comprises:

a body part extending through the stacked structure; and an extension part, connected with the body part, located between the stacked structure and the dielectric substrate, wherein the charge storage structure further covers the extension part.

2. The memory device according to claim 1, wherein the extension part further extends below the channel pillar and the plurality of conductive pillars.

3. The memory device according to claim 1, wherein a length of the extension part in a first direction is greater than a length of the extension part in a second direction.

4. The memory device according to claim 1, wherein the extension part comprises a first protrusion part extending toward the channel pillar.

5. The memory device according to claim 4, wherein a top surface of the first protrusion part is located between a top surface and a bottom surface of a bottommost insulating layer of the plurality of insulating layers.

6. The memory device according to claim 1, wherein bottom surfaces of the plurality of conductive pillars are located between a top surface and a bottom surface of a bottommost insulating layer of the plurality of insulating layers.

7. The memory device according to claim 1, wherein the extension part comprises a second protrusion part extending toward the dielectric substrate.

8. The memory device according to claim 1, wherein a height of the extension part in a first direction is greater than a height of the extension part in a second direction.

9. The memory device according to claim 1, wherein a cross section of the extension part in a first plan is a horizontal T shape, and a cross section of the extension part on a second plan is rectangular.

10. The memory device according to claim 1, wherein a top view of the extension part is semicircular or semielliptical.

11. The memory device according to claim 1, further comprising an insulating pillar, located in the channel pillar, separating the plurality of conductive pillars, wherein a first distance between the extension part and the insulating pillar in a first direction is smaller than a second distance between the extension part and the insulating pillar in a second direction.

12. The memory device according to claim 1, wherein a thickness of a bottommost insulating layer of the plurality of insulating layers is greater than a thickness of an insulating layer of the plurality of insulating layers between the plurality of conductive layers.

13. The memory device according to claim 1, wherein the extension part comprises a first part and a second part, and the first part is located above the second part and separated from each other.

14. A method of fabricating a memory device, comprising:

forming a first conductive layer on a dielectric substrate;

forming a stacked structure on the first conductive layer, wherein the stacked structure includes a plurality of intermediate layers and a plurality of insulating layers stacked alternately;

forming a channel pillar extending through the stacked structure and the first conductive layer;

forming a plurality of conductive pillars electrically connected to the channel pillar within the channel pillar;

forming a slit trench extending through the stacked structure and the first conductive layer;

removing portions of the first conductive layer, the channel pillar and the plurality of conductive pillars to form a first horizontal opening;

partially removing the plurality of intermediate layers to form a plurality of second horizontal openings;

forming a charge storage layer in the first horizontal opening and the plurality of second horizontal openings;

forming a plurality of second conductive layers in the plurality of second horizontal openings, wherein the charge storage structure is located between the plurality of second conductive layers and the channel pillar; and forming a body part of a slit in the slit trench, and an extension part of the slit in the first horizontal opening, wherein the extension part is connected with the body part and located between the stacked structure and the dielectric substrate, and the charge storage structure further covers the extension part.

15. The method of fabricating the memory device according to claim 14, further comprising forming an insulating pillar, in the channel pillar, separating the plurality of conductive pillars, wherein a first distance between the extension part and the insulating pillar in a first direction is smaller than a second distance between the extension part and the insulating pillar in a second direction.

16. The method of fabricating the memory device according to claim 14, wherein a top surface of the first horizontal opening is located between a top surface and a bottom surface of a bottommost insulating layer of the plurality of insulating layers.

17. The method of fabricating the memory device according to claim 14, wherein bottom surfaces of the plurality of conductive pillars are located between a top surface and a bottom surface of a bottommost insulating layer of the plurality of insulating layers.

18. The method of fabricating the memory device according to claim 14, wherein a cross section of the extension part on a first plan is a horizontal T shape, and a cross section of the extension part on a second plan is rectangular.

19. The method of fabricating the memory device according to claim 14, wherein a top view of the extension part is semicircular or semielliptical.

\* \* \* \* \*